US011337293B2

(12) United States Patent
Kobayashi et al.

(10) Patent No.: US 11,337,293 B2
(45) Date of Patent: May 17, 2022

(54) EXTREME ULTRAVIOLET LIGHT GENERATION SYSTEM AND ELECTRONIC DEVICE MANUFACTURING METHOD

(71) Applicant: Gigaphoton Inc., Tochigi (JP)

(72) Inventors: Takanari Kobayashi, Oyama (JP); Hirokazu Hosoda, Oyama (JP)

(73) Assignee: Gigaphoton Inc., Tochigi (JP)

( * ) Notice: Subject to any disclaimer, the term of this patent is extended or adjusted under 35 U.S.C. 154(b) by 126 days.

(21) Appl. No.: 16/894,657

(22) Filed: Jun. 5, 2020

(65) Prior Publication Data

US 2021/0026254 A1    Jan. 28, 2021

(30) Foreign Application Priority Data

Jul. 23, 2019   (JP) .............................. JP2019-135009

(51) Int. Cl.
*H05G 2/00*    (2006.01)
*G03F 7/20*    (2006.01)

(52) U.S. Cl.
CPC ......... *H05G 2/008* (2013.01); *G03F 7/70025* (2013.01); *G03F 7/70033* (2013.01); *G03F 7/70041* (2013.01); *G03F 7/70558* (2013.01); *H05G 2/003* (2013.01)

(58) Field of Classification Search
None
See application file for complete search history.

(56) References Cited

U.S. PATENT DOCUMENTS

| 8,791,440 B1 | 7/2014 | Tao et al. |
| 2013/0094529 A1* | 4/2013 | Wakabayashi ........ H01S 3/2391 372/27 |
| 2016/0073487 A1 | 3/2016 | Yanagida et al. |
| 2019/0239329 A1 | 8/2019 | Yanagida |
| 2020/0119514 A1* | 4/2020 | Ando ........................ H01S 3/11 |

FOREIGN PATENT DOCUMENTS

| JP | 2007305777 A | * 11/2007 | |
| WO | 2018/083727 A1 | 5/2018 | |
| WO | WO-2019008719 A1 | * 1/2019 | ............. H05G 2/008 |

OTHER PUBLICATIONS

Dutch Search Report and Written Opinion mailed by the Netherlands Patent Office dated Dec. 7, 2020, which corresponds to Dutch Patent Application No. 2025612 and is related to U.S. Appl. No. 16/894,657.

* cited by examiner

*Primary Examiner* — Michelle M Iacoletti
(74) *Attorney, Agent, or Firm* — Studebaker & Brackett PC

(57) ABSTRACT

An extreme ultraviolet light generation system includes: a chamber; a target generation unit; a laser system configured to output a first pre-pulse laser beam, a second pre-pulse laser beam, and a main pulse laser beam so that fluence of the first pre-pulse laser beam is 1.5 J/cm² to 16 J/cm² inclusive at a position where a target is irradiated with the first pre-pulse laser beam; and a control unit configured to control the laser system so that a first delay time from a timing of irradiation of the target with the first pre-pulse laser beam to a timing of irradiation with the second pre-pulse laser beam and a second delay time from the timing of irradiation of the target with the second pre-pulse laser beam to a timing of irradiation with the main pulse laser beam have a following relation:

the first delay time<the second delay time.

8 Claims, 21 Drawing Sheets

EXTREME ULTRAVIOLET LIGHT GENERATION SYSTEM AND ELECTRONIC DEVICE MANUFACTURING METHOD

CROSS-REFERENCE TO RELATED APPLICATIONS

This application claims the benefit of Japanese Patent Application No. 2019-135009, filed on Jul. 23, 2019, the entire contents of which are hereby incorporated by reference.

BACKGROUND

1. Technical Field

The present disclosure relates to an extreme ultraviolet light generation system and an electronic device manufacturing method.

2. Related Art

Recently, miniaturization of a transfer pattern in optical lithography of a semiconductor process has been rapidly proceeding along with miniaturization of the semiconductor process. Minute fabrication at 70 nm to 45 nm, furthermore minute fabrication at 32 nm or smaller will be requested in the next generation technology. To meet the request for minute fabrication at 32 nm or smaller, for example, it is desired to develop an exposure device including an extreme ultraviolet light generation device configured to generate extreme ultraviolet (EUV) light at a wavelength of 13 nm approximately in combination with reduced projection reflection optics.

Disclosed EUV light generation devices include the three kinds of devices of a laser produced plasma (LPP) device that uses plasma generated by irradiating a target material with a pulse laser beam, a discharge produced plasma (DPP) device that uses plasma generated by electrical discharge, and a synchrotron radiation (SR) device that uses synchrotron radiation.

LIST OF DOCUMENTS

Patent Document

Patent Document 1: US Published Patent Application No. 2016/073487

SUMMARY

An extreme ultraviolet light generation system according to an aspect of the present disclosure includes: a chamber; a target generation unit configured to output a target toward a predetermined region in the chamber; a laser system configured to output a first pre-pulse laser beam, a second pre-pulse laser beam, and a main pulse laser beam to irradiate the target with the first pre-pulse laser beam, the second pre-pulse laser beam, and the main pulse laser beam in this order so that fluence of the first pre-pulse laser beam is 1.5 J/cm$^2$ to 16 J/cm$^2$ inclusive at a position where the target is irradiated with the first pre-pulse laser beam; and a control unit configured to control the laser system so that a first delay time from a timing of irradiation of the target with the first pre-pulse laser beam to a timing of irradiation of the target with the second pre-pulse laser beam and a second delay time from the timing of irradiation of the target with the second pre-pulse laser beam to a timing of irradiation of the target with the main pulse laser beam have a following relation:

the first delay time<the second delay time.

An extreme ultraviolet light generation system according to another aspect of the present disclosure includes: a chamber; a target generation unit configured to output a target toward a predetermined region in the chamber; a laser system configured to output a first pre-pulse laser beam having a pulse time width in an order of nanoseconds, a second pre-pulse laser beam having a pulse time width in an order of picoseconds, a third pre-pulse laser beam, and a main pulse laser beam to irradiate the target with the first pre-pulse laser beam, the second pre-pulse laser beam, the third pre-pulse laser beam, and the main pulse laser beam in this order; and a control unit configured to control the laser system so that a first delay time from a timing of irradiation of the target with the first pre-pulse laser beam to a timing of irradiation of the target with the second pre-pulse laser beam and a second delay time from the timing of irradiation of the target with the second pre-pulse laser beam to a timing of irradiation of the target with the main pulse laser beam have a following relation:

the first delay time<the second delay time.

An electronic device manufacturing method according to an aspect of the present disclosure includes: generating extreme ultraviolet light by irradiating a target with a pulse laser beam in an extreme ultraviolet light generation system; outputting the extreme ultraviolet light to an exposure apparatus; and exposing a photosensitive substrate to the extreme ultraviolet light in the exposure apparatus to manufacture an electronic device, the extreme ultraviolet light generation system including a chamber, a target generation unit configured to output a target toward a predetermined region in the chamber, a laser system configured to output a first pre-pulse laser beam, a second pre-pulse laser beam, and a main pulse laser beam to irradiate the target with the first pre-pulse laser beam, the second pre-pulse laser beam, and the main pulse laser beam in this order so that fluence of the first pre-pulse laser beam is 1.5 J/cm$^2$ to 16 J/cm$^2$ inclusive at a position where the target is irradiated with the first pre-pulse laser beam, and a control unit configured to control the laser system so that a first delay time from a timing of irradiation of the target with the first pre-pulse laser beam to a timing of irradiation of the target with the second pre-pulse laser beam and a second delay time from the timing of irradiation of the target with the second pre-pulse laser beam to a timing of irradiation of the target with the main pulse laser beam have a following relation:

the first delay time<the second delay time.

An electronic device manufacturing method according to another aspect of the present disclosure includes: generating extreme ultraviolet light by irradiating a target with a pulse laser beam in an extreme ultraviolet light generation system; outputting the extreme ultraviolet light to an exposure apparatus; and exposing a photosensitive substrate to the extreme ultraviolet light in the exposure apparatus to manufacture an electronic device, the extreme ultraviolet light generation system including a chamber, a target generation unit configured to output a target toward a predetermined region in the chamber, a laser system configured to output a first pre-pulse laser beam having a pulse time width in an order of nanoseconds, a second pre-pulse laser beam having a pulse time width in an order of picoseconds, a third pre-pulse laser beam, and a main pulse laser beam to irradiate the target with the first pre-pulse laser beam, the second pre-pulse laser beam, the third pre-pulse laser beam, and the main pulse laser beam in this order, and a control unit configured to control the laser system so that a first delay time from a timing of irradiation of the target with the first pre-pulse laser beam to a timing of irradiation of the target with the second pre-pulse laser beam and a second delay time from the timing of irradiation of the target with the second pre-pulse laser beam to a timing of irradiation of the target with the main pulse laser beam have a following relation:

the first delay time<the second delay time.

BRIEF DESCRIPTION OF THE DRAWINGS

Embodiments of the present disclosure will be described below as examples with reference to the accompanying drawings.

DESCRIPTION OF EMBODIMENTS

<Contents>
1. Overall description of extreme ultraviolet light generation system
   1.1 Configuration
   1.2 Operation 2. EUV light generation system according to comparative example
  2.1 Configuration
  2.2 Operation
    2.2.1 Outputting of target
    2.2.2 Outputting of pulse laser beam
    2.2.3 Transmission of pulse laser beam
    2.2.4 Condensation of pulse laser beam
  2.3 Details of first pre-pulse laser
    2.3.1 Configuration
    2.3.2 Operation
  2.4 Exemplary irradiation condition
  2.5 Problem
3. EUV light generation system in which generation of ions having high ion energy is reduced
  3.1 Configuration
  3.2 Operation
  3.3 Effect
    3.3.1 Ion energy
    3.3.2 Conversion efficiency (CE)
  3.4 First pre-pulse laser including regenerative amplifier
    3.4.1 Configuration
    3.4.2 Operation
      3.4.2.1 Case in which voltage V3 is not applied to pockels cell PC1
      3.4.2.2 Case in which voltage V3 is applied to pockels cell PC1
      3.4.2.3 Generation of first and second pre-pulse laser beams
    3.4.3 Effect
  3.5 Regenerative amplifier including two pockels cells
    3.5.1 Configuration
    3.5.2 Operation
    3.5.3 Effect
  3.6 First pre-pulse laser including delay optical path
    3.6.1 Configuration
    3.6.2 Operation and effect
  3.7 First pre-pulse laser beam of the order of nanoseconds
    3.7.1 Configuration
    3.7.2 Ion energy
4. Main pulse laser configured to generate two pulses
  4.1 Configuration
  4.2 Operation
  4.3 Effect
  4.4 Main pulse laser configured to generate main pulse including pedestal part
    4.4.1 Configuration
    4.4.2 Operation
    4.4.3 Effect
5. Other Embodiments of the present disclosure will be described below in detail with reference to the accompanying drawings. The embodiments described below are examples of the present disclosure, and do not limit the contents of the present disclosure. Not all configurations and operations described in each embodiment are necessarily essential as configurations and operations of the present disclosure. Components identical to each other are denoted by an identical reference sign, and duplicate description thereof will be omitted.

Figure 1:
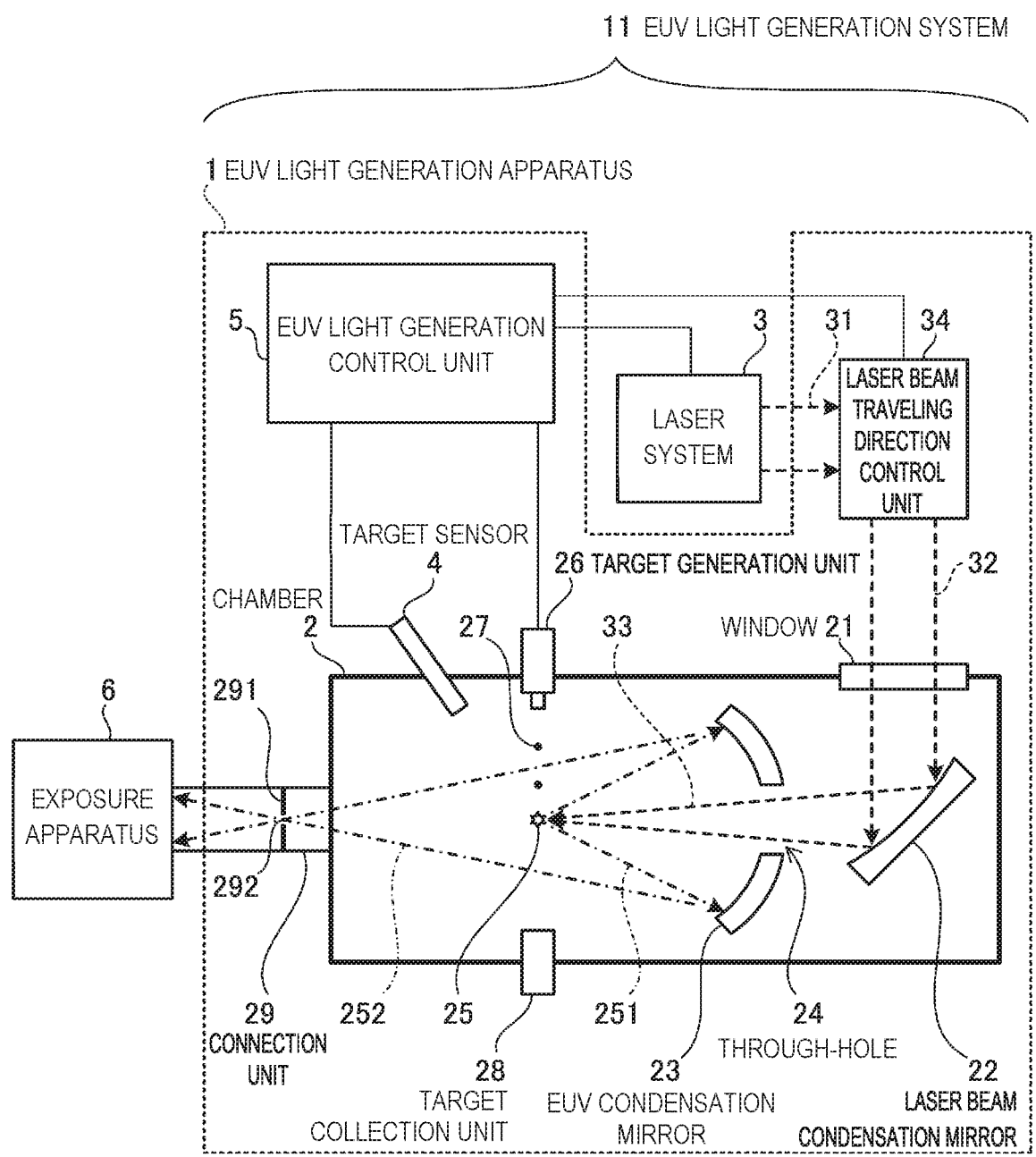
FIG. 1 schematically illustrates the configuration of an exemplary LPP EUV light generation system.

1. Overall Description of Extreme Ultraviolet Light Generation System 1.1 Configuration FIG. 1 schematically illustrates the configuration of an exemplary LPP EUV light generation system 11. An EUV light generation apparatus 1 is used together with at least one laser system 3. In the present application, a system including the EUV light generation apparatus 1 and the laser system 3 is referred to as the EUV light generation system 11. As illustrated in FIG. 1 and described below in detail, the EUV light generation apparatus 1 includes a chamber 2 and a target generation unit 26. The chamber 2 is configured to be sealable. The target generation unit 26 is attached, for example, to penetrate through a wall of the chamber 2. The material of a target substance output from the target generation unit 26 contains tin. The material of the target substance may contain tin in combination with terbium, gadolinium, lithium, or xenon.

The wall of the chamber 2 is provided with at least one through-hole. The through-hole is provided with a window 21. A pulse laser beam 32 output from the laser system 3 transmits through the window 21. For example, an EUV condensation mirror 23 having a rotational spheroidal reflective surface is disposed inside the chamber 2. The EUV condensation mirror 23 has first and second focal points. For example, a multi-layer reflective film obtained by alternately stacking molybdenum and silicon is formed on the surface of the EUV condensation mirror 23. The EUV condensation mirror 23 is disposed so that, for example, the first focal point is positioned in a plasma generation region 25 and the second focal point is positioned at an intermediate focal point (IF) 292. A through-hole 24 is provided at a central part of the EUV condensation mirror 23. A pulse laser beam 33 passes through the through-hole 24.

The EUV light generation apparatus 1 includes an EUV light generation control unit 5, a target sensor 4, and the like. The target sensor 4 has an image capturing function and detects the existence, locus, position, speed, and the like of a target 27.

In addition, the EUV light generation apparatus 1 includes a connection unit 29 configured to provide communication between the inside of the chamber 2 and the inside of an exposure apparatus 6. A wall 291 through which an aperture is formed is provided inside the connection unit 29. The wall 291 is disposed so that the aperture is positioned at the second focal point position of the EUV condensation mirror 23.

In addition, the EUV light generation apparatus 1 includes a laser beam traveling direction control unit 34, a laser beam condensation mirror 22, a target collection unit 28 for collecting the target 27, and the like. The laser beam traveling direction control unit 34 includes an optical element for defining the traveling direction of a laser beam, and an actuator for adjusting the position, posture, and the like of the optical element.

1.2 Operation

As illustrated in FIG. 1, a pulse laser beam 31 output from the laser system 3 passes through the laser beam traveling direction control unit 34 and is incident in the chamber 2 through the window 21 as the pulse laser beam 32. The pulse laser beam 32 travels along at least one laser beam path in the chamber 2 and is reflected by the laser beam condensation mirror 22 and incident on the at least one target 27 as the pulse laser beam 33.

The target generation unit 26 outputs the target 27 toward the plasma generation region 25 inside the chamber 2. The target 27 is irradiated with at least one pulse included in the pulse laser beam 33. Plasma is generated from the target 27 irradiated with the pulse laser beam and radiates radiation light 251. The EUV condensation mirror 23 reflects EUV light included in the radiation light 251 at a reflectance higher than that for light in other wavelength bands. A reflected light 252 including the EUV light reflected by the EUV condensation mirror 23 is condensed at the intermediate focal point 292 and output to the exposure apparatus 6. One target 27 may be irradiated with a plurality of pulses included in the pulse laser beam 33.

The EUV light generation control unit 5 collectively controls the entire EUV light generation system 11. The EUV light generation control unit 5 processes image data of the target 27 captured by the target sensor 4, and the like. In addition, the EUV light generation control unit 5 controls, for example, the output timing and output direction of the target 27. In addition, the EUV light generation control unit 5 controls, for example, the oscillation timing of the laser system 3, the traveling direction of the pulse laser beam 32, and the focusing position of the pulse laser beam 33. These various kinds of control are merely exemplary, and may include other control as necessary.

Figure 2:
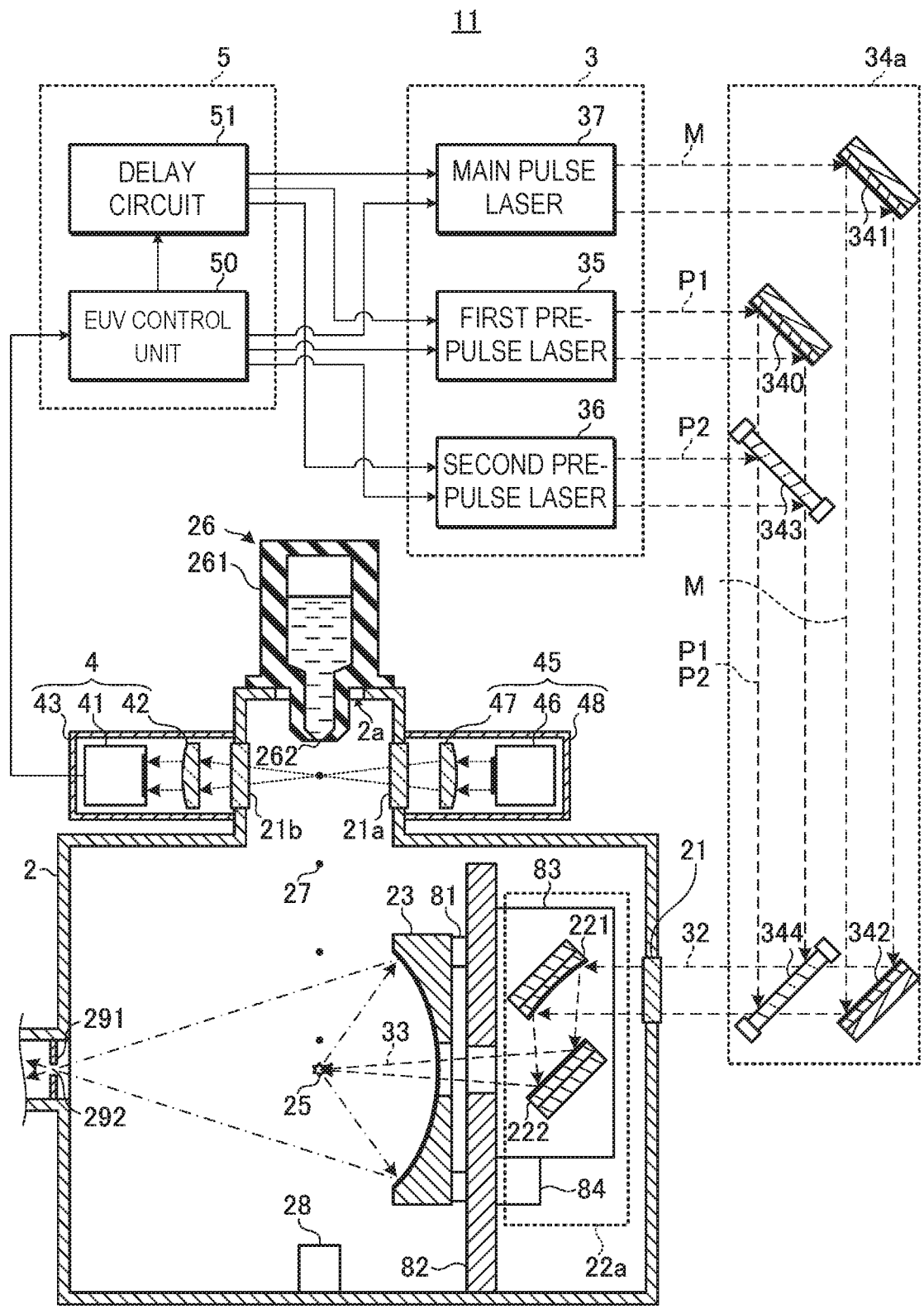
FIG. 2 is a partially cross-sectional view illustrating the configuration of an EUV light generation system according to a comparative example.

2. EUV Light Generation System According to Comparative Example 2.1 Configuration FIG. 2 is a partially cross-sectional view illustrating the configuration of the EUV light generation system 11 according to a comparative example. As illustrated in FIG. 2, a laser beam condensation optical system 22a, the EUV condensation mirror 23, the target collection unit 28, an EUV condensation mirror holder 81, plates 82 and 83, and a position adjustment mechanism 84 are provided inside the chamber 2. The target generation unit 26, the target sensor 4, and a light emission unit 45 are attached to the chamber 2. The laser system 3, a laser beam traveling direction control unit 34a, and the EUV light generation control unit 5 are provided outside the chamber 2. The EUV light generation control unit 5 includes an EUV control unit 50 and a delay circuit 51.

The target generation unit 26 includes a reservoir 261. The reservoir 261 stores inside a target material being melted. Part of the reservoir 261 penetrates through a through-hole 2a formed at the wall surface of the chamber 2 so that an opening 262 at a leading end of the reservoir 261 is positioned inside the chamber 2.

The target sensor 4 and the light emission unit 45 are disposed on sides opposite to each other with respect to the trajectory of the target 27. Windows 21a and 21b are attached to the chamber 2. The window 21a is positioned between the light emission unit 45 and the trajectory of the target 27. The window 21b is positioned between the trajectory of the target 27 and the target sensor 4.

The target sensor 4 includes an optical sensor 41, a condensation optical system 42, and a container 43. The container 43 is fixed outside the chamber 2, and the optical sensor 41 and the condensation optical system 42 are fixed in the container 43. The light emission unit 45 includes a light source 46, a condensation optical system 47, and a container 48. The container 48 is fixed outside the chamber 2, and the light source 46 and the condensation optical system 47 are fixed in the container 48.

The laser system 3 includes a first pre-pulse laser 35, a second pre-pulse laser 36, and a main pulse laser 37. The first pre-pulse laser 35 and the second pre-pulse laser 36 each include, for example, a YAG laser apparatus. The main pulse laser 37 includes, for example, a $CO_2$ laser apparatus.

A first pre-pulse laser beam P1 output from the first pre-pulse laser 35 is linearly polarized light including a first wavelength component and having a polarization direction parallel to the sheet. A second pre-pulse laser beam P2 output from the second pre-pulse laser 36 is linearly polarized light including a first wavelength component and having a polarization direction orthogonal to the sheet. A main pulse laser beam M output from the main pulse laser 37 includes a second wavelength component.

The laser beam traveling direction control unit 34a includes high reflectance mirrors 340, 341, and 342 and beam combiners 343 and 344.

The beam combiner 343 includes a polarization beam splitter that transmits linearly polarized light having a polarization direction parallel to the sheet at high transmittance and reflects linearly polarized light having a polarization direction orthogonal to the sheet at high reflectance.

The beam combiner 344 includes a dichroic mirror that reflects light including the first wavelength component at high reflectance and transmits light including the second wavelength component at high transmittance.

The plate 82 is fixed to the chamber 2. The plate 83 is supported to the plate 82. The laser beam condensation optical system 22a includes an off-axis parabolic mirror 221 and a planar mirror 222.

The position adjustment mechanism 84 can adjust the position of the plate 83 relative to the plate 82. The positions of the off-axis parabolic mirror 221 and the planar mirror 222 are adjusted through adjustment of the position of the plate 83. The positions of the off-axis parabolic mirror 221 and the planar mirror 222 are adjusted so that the pulse laser beam 33 reflected by these mirrors is condensed in the plasma generation region 25.

The EUV condensation mirror 23 is fixed to the plate 82 through the EUV condensation mirror holder 81.

2.2 Operation 2.2.1 Outputting of Target

The target generation unit 26 outputs the target 27 in droplet form toward the plasma generation region 25 through the opening 262. The target collection unit 28 collects the target 27 having passed through the plasma generation region 25.

Light output from the light source 46 included in the light emission unit 45 is condensed to a position substantially on the trajectory of the target 27 through the condensation optical system 47. As the target 27 passes through the focusing position of the output light from the light emission unit 45, the target sensor 4 detects change in the light intensity of light passing through the trajectory of the target 27 and the circumference thereof, and outputs a target detection signal. The EUV control unit 50 receives the target detection signal.

2.2.2 Outputting of Pulse Laser Beam

The EUV control unit 50 transmits a signal for setting a pulse time width and a pulse energy to each of the first pre-pulse laser 35, the second pre-pulse laser 36, and the main pulse laser 37.

The EUV control unit 50 outputs the target detection signal to the delay circuit 51.

The delay circuit 51 outputs, to the first pre-pulse laser 35, a first trigger signal indicating that a first trigger delay time has elapsed since the reception timing of the target detection signal. The first pre-pulse laser 35 outputs the first pre-pulse laser beam P1 in accordance with the first trigger signal.

The delay circuit 51 outputs, to the second pre-pulse laser 36, a second trigger signal indicating that a second trigger delay time longer than the first trigger delay time has elapsed since the reception timing of the target detection signal. The second pre-pulse laser 36 outputs the second pre-pulse laser beam P2 in accordance with the second trigger signal.

The delay circuit 51 outputs, to the main pulse laser 37, a third trigger signal indicating that a third trigger delay time longer than the second trigger delay time has elapsed since the reception timing of the target detection signal. The main pulse laser 37 outputs the main pulse laser beam M in accordance with the third trigger signal.

In this manner, the laser system 3 outputs the first pre-pulse laser beam P1, the second pre-pulse laser beam P2, and the main pulse laser beam M in this order.

2.2.3 Transmission of Pulse Laser Beam

The high reflectance mirror 340 included in the laser beam traveling direction control unit 34a reflects the first pre-pulse laser beam P1 at high reflectance.

The beam combiner 343 transmits the first pre-pulse laser beam P1 having a polarization direction parallel to the sheet at high transmittance. The beam combiner 343 reflects the second pre-pulse laser beam P2 having a polarization direction orthogonal to the sheet at high reflectance.

The high reflectance mirrors 341 and 342 reflect the main pulse laser beam M at high reflectance.

The beam combiner 344 reflects the first and second pre-pulse laser beams P1 and P2 including the first wavelength component at high reflectance. The beam combiner 344 transmits the main pulse laser beam M including the second wavelength component at high transmittance. The first pre-pulse laser beam P1, the second pre-pulse laser beam P2, and the main pulse laser beam M are incident on the laser beam condensation optical system 22a as the pulse laser beam 32.

2.2.4 Condensation of Pulse Laser Beam

The off-axis parabolic mirror 221 included in the laser beam condensation optical system 22a reflects the pulse laser beam 32 toward the planar mirror 222. The planar mirror 222 reflects the pulse laser beam 32 as the pulse laser beam 33. The pulse laser beam 33 is condensed in or near the plasma generation region 25 in accordance with the reflective surface shape of the off-axis parabolic mirror 221.

In or near the plasma generation region 25, one target 27 is irradiated with the first pre-pulse laser beam P1, the second pre-pulse laser beam P2, and the main pulse laser beam M in this order. When irradiated with the first pre-pulse laser beam P1, the target 27 in droplet form is broken down into a plurality of fine particles and diffused, and accordingly, a secondary target is generated. When irradiated with the second pre-pulse laser beam P2, the secondary target is broken down into finer particles, and accordingly, a tertiary target including at least steam is generated. When the tertiary target is irradiated with the main pulse laser beam M, plasma is efficiently generated from the target, and accordingly, EUV light is generated.

2.3 Details of First Pre-Pulse Laser 2.3.1 Configuration

Figure 3A:
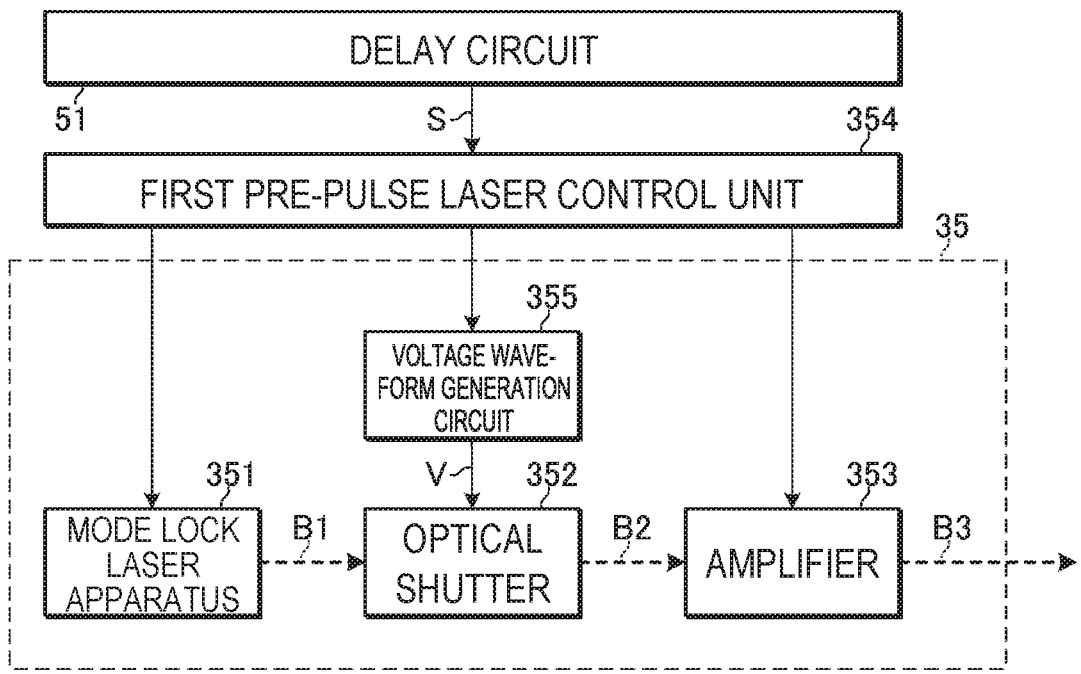
FIG. 3A is a block diagram illustrating the configuration of a first pre-pulse laser in the comparative example.

FIG. 3A is a block diagram illustrating the configuration of the first pre-pulse laser 35 in the comparative example. The first pre-pulse laser 35 includes a mode lock laser apparatus 351, an optical shutter 352, an amplifier 353, and a voltage waveform generation circuit 355.

A first pre-pulse laser control unit 354 is connected to the delay circuit 51 and the first pre-pulse laser 35 through signal lines as being arranged therebetween. The first pre-pulse laser control unit 354 may be included in the EUV light generation control unit 5 or may be integrated with the EUV light generation control unit 5.

The mode lock laser apparatus 351 is a master oscillator including an optical resonator (not illustrated), an amplification medium (not illustrated), and a saturable absorber (not illustrated). The amplification medium contains, for example, neodymium-doped yttrium orthovanadate (Nd:YVO$_4$) crystal. A pulse laser beam B1 output from the mode lock laser apparatus 351 has, for example, a repetition frequency of 20 MHz, and each pulse has a pulse time width in the order of picoseconds. The repetition frequency of the pulse laser beam B1 depends on the resonator length of the optical resonator included in the mode lock laser apparatus 351.

The optical shutter 352 is disposed on the optical path of the pulse laser beam B1. The optical shutter 352 includes, for example, a pockels cell (not illustrated) and a polarizer (not illustrated). The pulse laser beam B1 does not transmit through the optical shutter 352 when no optical shutter control voltage V is applied to the optical shutter 352. The pulse laser beam B1 transmits through the optical shutter 352 as a pulse laser beam B2 when the optical shutter control voltage V is applied to the optical shutter 352.

The amplifier 353 is disposed on the optical path of the pulse laser beam B2. The amplifier 353 uses, for example, neodymium-doped yttrium aluminum garnet (Nd:YAG) crystal. The amplifier 353 may be a multipath slab amplifier or a fiber amplifier. The amplifier 353 amplifies and outputs the pulse laser beam B2 as a pulse laser beam B3.

The voltage waveform generation circuit 355 generates the voltage waveform of the optical shutter control voltage V, and applies the optical shutter control voltage V to the optical shutter 352. The first pre-pulse laser control unit 354 controls the mode lock laser apparatus 351, the amplifier 353, and the voltage waveform generation circuit 355.

2.3.2 Operation

Figure 3B:
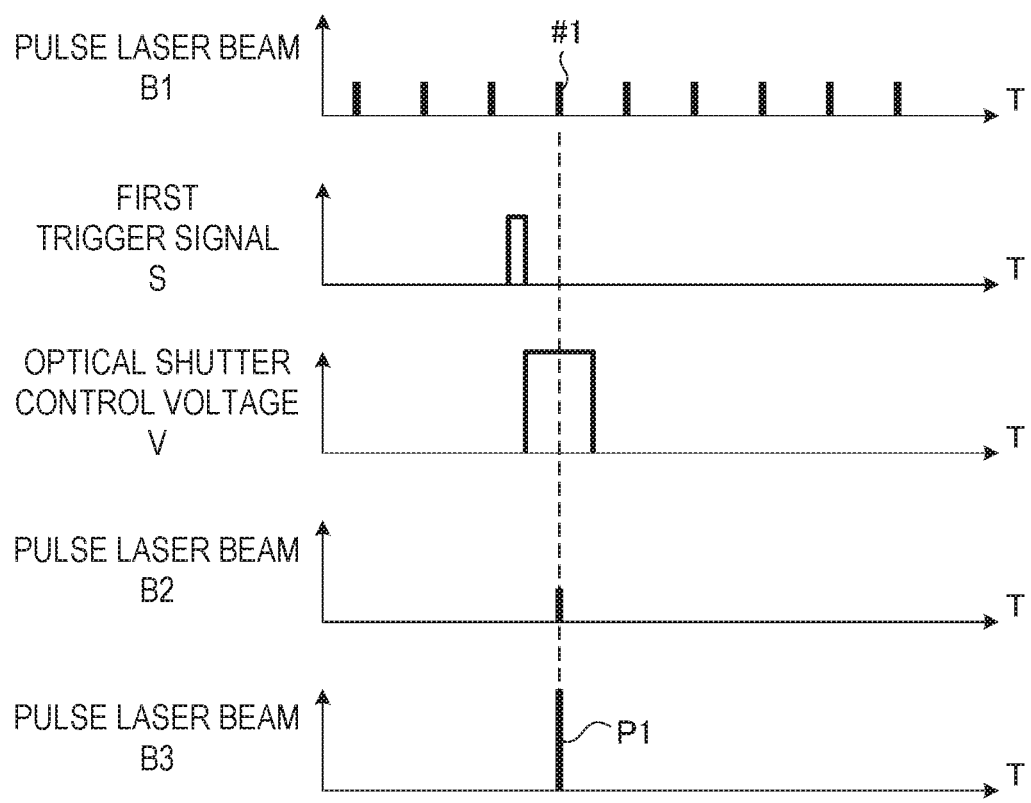
FIG. 3B is a time chart of the first pre-pulse laser in the comparative example.

FIG. 3B is a time chart of the first pre-pulse laser 35 in the comparative example. In FIG. 3B, the horizontal axis represents time T. The vertical axis represents signal strength or pulse laser beam energy. In FIG. 3B, a dashed line in the vertical direction indicates that operations on the dashed line occur at timings substantially identical to each other.

The first pre-pulse laser control unit 354 transmits a control signal to the voltage waveform generation circuit 355 in accordance with a first trigger signal S transmitted from the delay circuit 51. The voltage waveform generation circuit 355 generates the optical shutter control voltage V in accordance with the control signal. The optical shutter control voltage V is, for example, pulse voltage having a rectangular voltage waveform. The pulse time width of the pulse voltage is set to be a time equal to or shorter than the pulse generation period of the pulse laser beam B1. The pulse generation period of the pulse laser beam B1 corresponds to the reciprocal of the repetition frequency of the pulse laser beam B1. When the repetition frequency of the pulse laser beam B1 is 20 MHz, the pulse time width of the optical shutter control voltage V is set to be 50 ns or shorter.

The optical shutter 352 allows one Pulse #1 among a plurality of pulses included in the pulse laser beam B1 to pass therethrough as the pulse laser beam B2. The pulse laser beam B2 is amplified by the amplifier 353 and is output as the pulse laser beam B3. In the comparative example, the pulse laser beam B3 corresponds to the first pre-pulse laser beam P1. The first pre-pulse laser beam P1 has a pulse time width in the order of picoseconds.

2.4 Exemplary Irradiation Condition

Figure 4:
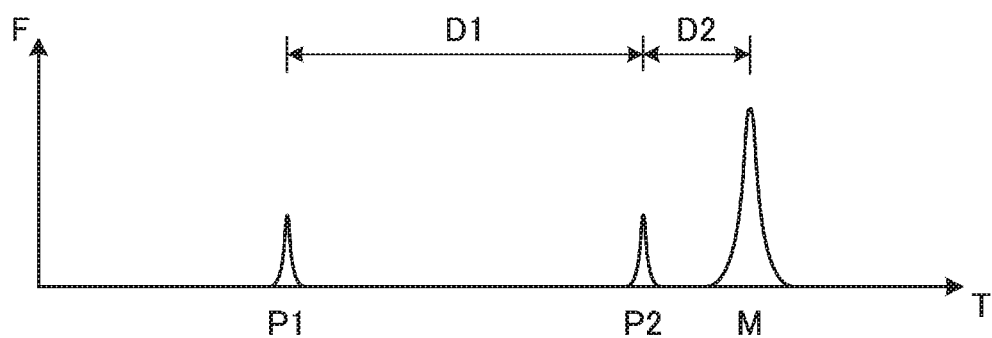
FIG. 4 is a pulse waveform diagram illustrating exemplary irradiation conditions of first and second pre-pulse laser beams and a main pulse laser beam in the comparative example.

FIG. 4 is a pulse waveform diagram illustrating exemplary irradiation conditions of the first and second pre-pulse laser beams P1 and P2 and the main pulse laser beam M in the comparative example.

In the comparative example, the target 27 was a melted tin droplet and has a diameter of 21 µm to 22 µm inclusive.

The first pre-pulse laser 35 included a mode lock laser using Nd:YVO$_4$ crystal and a regenerative amplifier using Nd:YAG crystal. The first pre-pulse laser beam P1 had a wavelength of 1.06 µm, a pulse time width of 14 ps at the full width at half maximum, and a spot diameter of 70 µm at the $1/e^2$ width. The $1/e^2$ width is the size of a part having a light intensity equal to or higher than $1/e^2$ of a peak value among beam profiles at a focal point. The number e is Napier's constant. The pulse energy of the first pre-pulse laser beam P1 was 0.25 mJ to 2 mJ inclusive.

The second pre-pulse laser 36 was a laser apparatus using Nd:YAG crystal. The second pre-pulse laser beam P2 had a wavelength of 1.06 µm, a pulse time width of 5 ns at the full width at half maximum, and a spot diameter of 400 µm at the $1/e^2$ width. The pulse energy of the second pre-pulse laser beam P2 was 1 mJ to 3.4 mJ inclusive.

The main pulse laser 37 was a $CO_2$ laser apparatus. The main pulse laser beam M had a wavelength of 10.6 µm, a pulse time width of 15 ns at the full width at half maximum, and a spot diameter of 300 µm at the $1/e^2$ width. The pulse energy of the main pulse laser beam M was 135 mJ to 170 mJ inclusive.

Delay times D1 and D2 between pulses had a relation as follows.

$$D1 > D2$$

The delay times D1 and D2 in the present specification are defined as follows.

The first delay time D1 is a delay time from the timing of irradiation of the target 27 with the first pre-pulse laser beam P1 to the timing of irradiation of the target 27 with the second pre-pulse laser beam P2.

The second delay time D2 is a delay time from the timing of irradiation of the target 27 with the second pre-pulse laser beam P2 to the timing of irradiation of the target 27 with the main pulse laser beam M.

2.5 Problem

Figure 5:
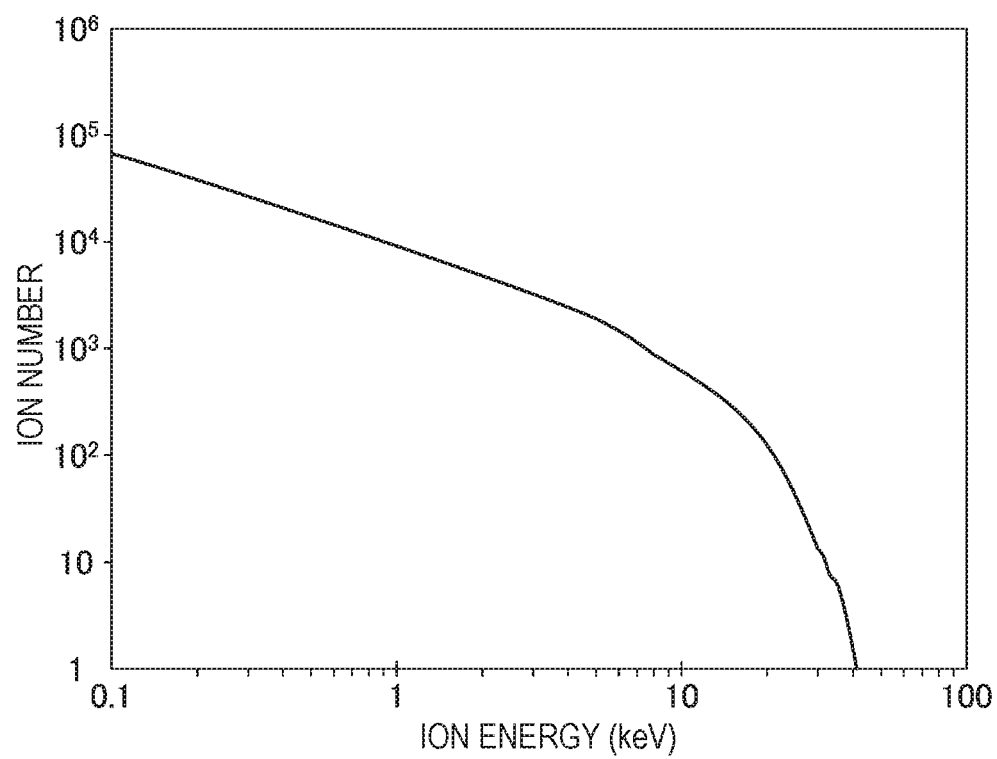
FIG. 5 is a graph illustrating the ion energy of ions generated when a target is irradiated with the first pre-pulse laser beam in the comparative example.

FIG. 5 is a graph illustrating the ion energy of ions generated when the target 27 is irradiated with the first pre-pulse laser beam P1 in the comparative example. In FIG. 5, the horizontal axis represents the ion energy. The vertical axis represents the number of ions. Here, one multivalent ion is also counted as one ion.

In the comparative example, when the target 27 is irradiated with the first pre-pulse laser beam P1 having a pulse time width of 14 ps, an ion having an ion energy of several tens keV is generated in some cases. An ion having high ion energy collides with the multi-layer reflective film of the EUV condensation mirror 23, enters the multi-layer reflective film, degrades the multi-layer reflective film, and causes reflectance decrease thereof in some cases.

Figure 6:
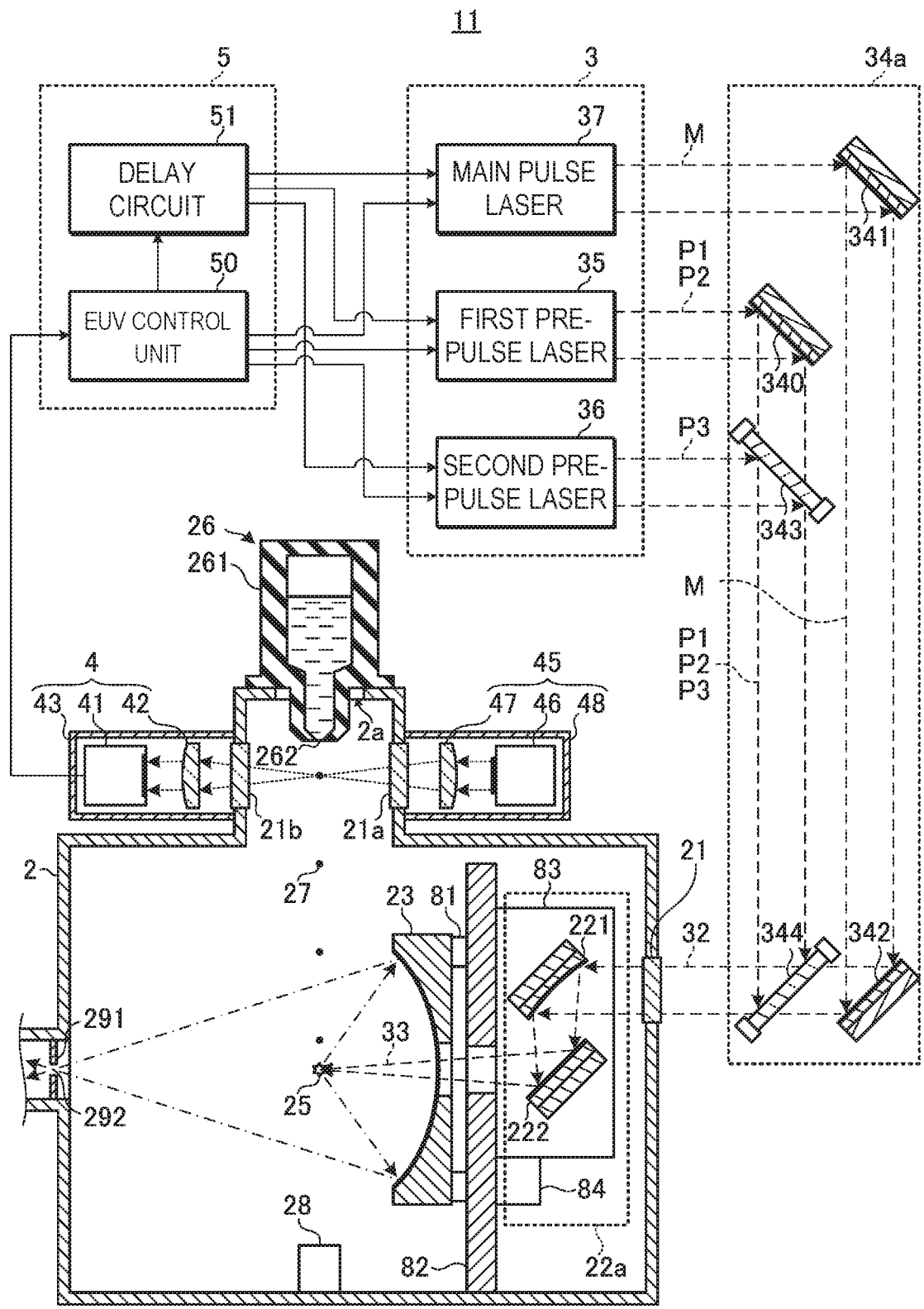
FIG. 6 is a partially cross-sectional view illustrating the configuration of an EUV light generation system according to a first embodiment of the present disclosure.

3. EUV Light Generation System in Which Generation of Ions Having High Ion Energy is Reduced 3.1 Configuration FIG. 6 is a partially cross-sectional view illustrating the configuration of the EUV light generation system 11 according to a first embodiment of the present disclosure. In the first embodiment, the first pre-pulse laser 35 outputs the first and second pre-pulse laser beams P1 and P2. The second pre-pulse laser 36 outputs a third pre-pulse laser beam P3. The configuration of the second pre-pulse laser 36 is same as that in the comparative example, and the third pre-pulse laser beam P3 in the first embodiment is same as the second pre-pulse laser beam P2 in the comparative example.

The laser system 3 outputs the first pre-pulse laser beam P1, the second pre-pulse laser beam P2, the third pre-pulse laser beam P3, and the main pulse laser beam M so that the target 27 is irradiated with these pulse laser beams in this order.

Any other feature of the first embodiment is same as that of the comparative example.

Figure 7A:
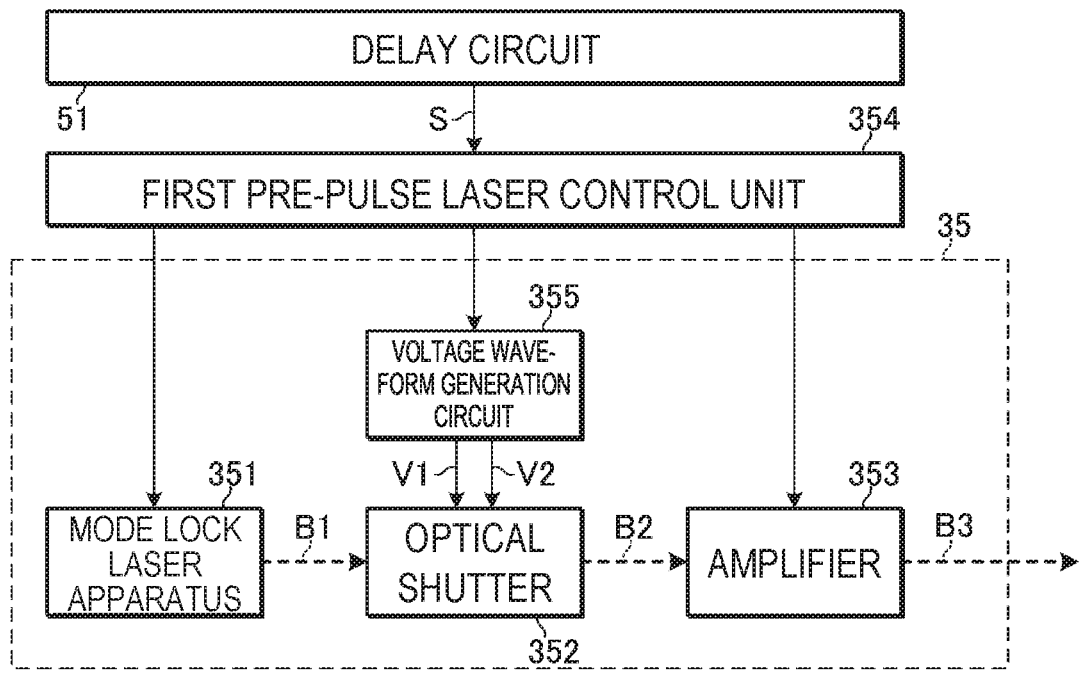
FIG. 7A is a block diagram illustrating the configuration of the first pre-pulse laser in the first embodiment.

FIG. 7A is a block diagram illustrating the configuration of the first pre-pulse laser 35 in the first embodiment. In the first embodiment, a plurality of signal lines may be provided to apply the optical shutter control voltage V from the voltage waveform generation circuit 355 to the optical shutter 352.

Any other feature of the configuration of the first pre-pulse laser 35 illustrated in FIG. 7A is same as the configuration of the first pre-pulse laser 35 described with reference to FIG. 3A.

3.2 Operation

Figure 7B:
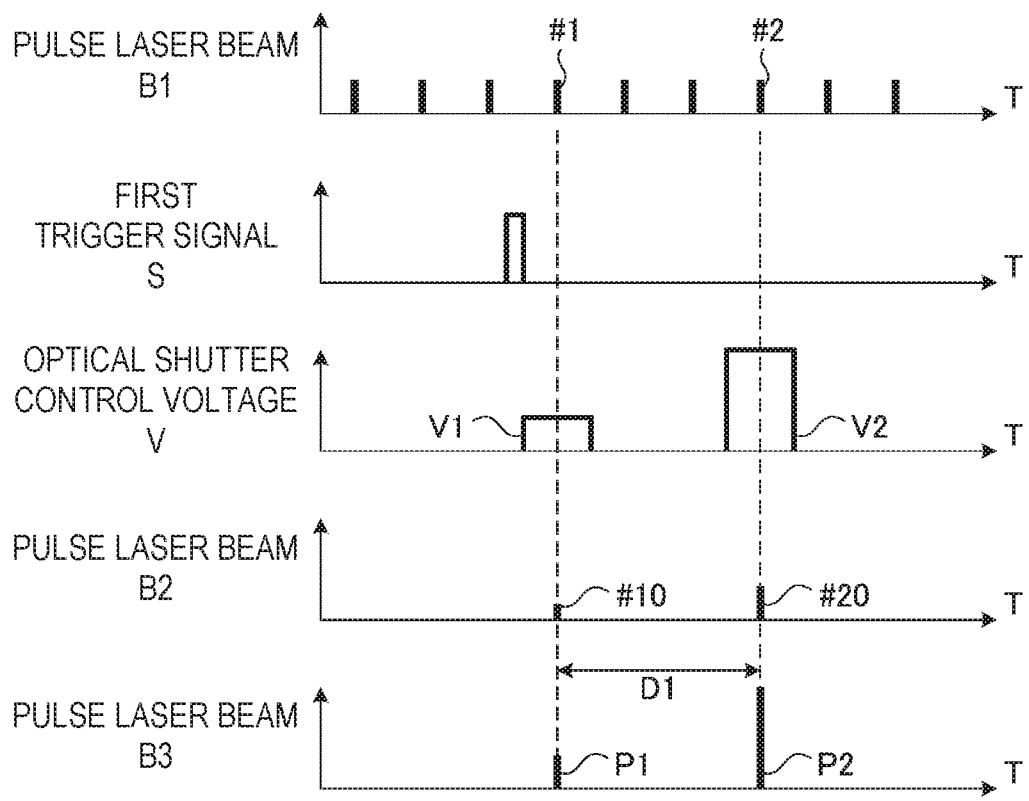
FIG. 7B is a time chart of the first pre-pulse laser in the first embodiment.

FIG. 7B is a time chart of the first pre-pulse laser 35 in the first embodiment. In FIG. 7B, the horizontal axis represents time T. The vertical axis represents signal strength or pulse laser beam energy.

In the first embodiment, the voltage waveform of the optical shutter control voltage V includes a first pulse voltage V1 and a second pulse voltage V2. The first pulse voltage V1 and the second pulse voltage V2 may be applied to the optical shutter 352 through signal lines different from each other. The first pulse voltage V1 has a first voltage value. The second pulse voltage V2 has a second voltage value higher than the first voltage value. The timings of generation of the first and second pulse voltages V1 and V2 are set so that the first delay time D1 from the timing of irradiation of the target 27 with the first pre-pulse laser beam P1 to the timing of irradiation of the target 27 with the second pre-pulse laser beam P2 is equal to a predetermined value. The first delay time D1 is preferably 5 ns to 100 ns inclusive. The first delay time D1 is set by any one of the EUV control unit 50, the delay circuit 51, and the first pre-pulse laser control unit 354.

Among a plurality of pulses included in the pulse laser beam B1, a pulse having reached the optical shutter 352 at a timing when the first pulse voltage V1 is applied to the optical shutter 352 is referred to as Pulse #1. Among the pulses included in the pulse laser beam B1, a pulse having reached the optical shutter 352 at a timing when the second pulse voltage V2 is applied to the optical shutter 352 is referred to as Pulse #2. The optical shutter 352 allows the two Pulses #1 and #2 to pass therethrough as Pulses #10 and #20, respectively. The transmittance of the optical shutter 352 when the first pulse voltage V1 is applied is set to be lower than the transmittance of the optical shutter 352 when the second pulse voltage V2 is applied. As a result, Pulse #10 has a pulse energy lower than that of Pulse #20.

Pulse #10 and Pulse #20 are amplified by the amplifier 353 and output as the first and second pre-pulse laser beams P1 and P2, respectively. The first pre-pulse laser beam P1 has a pulse energy lower than that of the second pre-pulse laser beam P2. The first and second pre-pulse laser beams P1 and P2 each have a pulse time width in the order of picoseconds. In the present disclosure, the order of picoseconds is equal to or larger than 0.1 ps and smaller than 1000 ps.

The optical shutter 352 and the amplifier 353 are each an exemplary optical device configured to generate a first pre-pulse laser beam and a second pre-pulse laser beam from at least one pulse of a plurality of pulses output from a mode lock laser apparatus.

As described above, in the first embodiment, the first pre-pulse laser beam P1 is generated by setting, as a first transmittance, the transmittance of the optical shutter 352 when Pulse #1 included in the pulse laser beam B1 reaches the optical shutter 352. Then, the second pre-pulse laser beam P2 is generated by setting, as a second transmittance higher than the first transmittance, the transmittance of the optical shutter 352 when Pulse #2 after Pulse #1 reaches the optical shutter 352.

The delay times D1, D3, and D4 between pulses desirably have a relation as follows.

$$D1 \leq D4 < D3$$

The delay times D3 and D4 in the present specification are defined as follows.

The third delay time D3 is a delay time from the timing of irradiation of the target 27 with the second pre-pulse laser beam P2 to the timing of irradiation of the target 27 with the third pre-pulse laser beam P3.

The fourth delay time D4 is a delay time from the timing of irradiation of the target 27 with the third pre-pulse laser beam P3 to the timing of irradiation of the target 27 with the main pulse laser beam M.

When only the first and second pre-pulse laser beams P1 and P2 and the main pulse laser beam M are considered or when the third pre-pulse laser beam P3 is omitted, the delay times D1 and D2 between pulses desirably have a relation as follows.

$$D1 < D2$$

3.3 Effect
3.3.1 Ion Energy

Figure 8A:
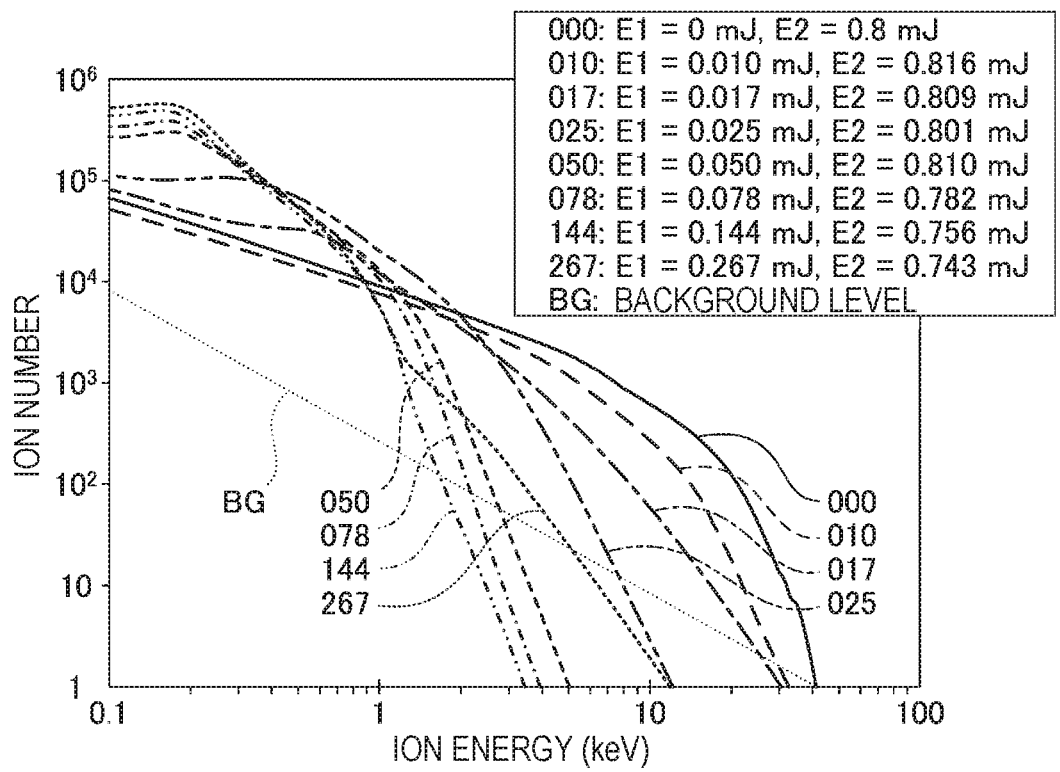
FIG. 8A is a graph illustrating the ion energy of ions generated when a target is irradiated with the first and second pre-pulse laser beams in the first embodiment.

FIG. 8A is a graph illustrating the ion energy of ions generated when the target 27 is irradiated with the first and second pre-pulse laser beams P1 and P2 in the first embodiment. In FIG. 8A, the horizontal axis represents the ion energy. The vertical axis represents the number of ions. E1 represents the pulse energy of the first pre-pulse laser beam P1, and E2 represents the pulse energy of the second pre-pulse laser beam P2.

In measurement of the ion energy illustrated in FIG. 8A, the first and second pre-pulse laser beams P1 and P2 each had a pulse time width of 18.8 ps at the full width at half maximum and a spot diameter of 50 μm at the $1/e^2$ width.

The first delay time D1 from the timing of irradiation of the target 27 with the first pre-pulse laser beam P1 to the timing of irradiation of the target 27 with the second pre-pulse laser beam P2 was 13 ns.

As indicated by Reference sign 000 in FIG. 8A, when the pulse energy E1 of the first pre-pulse laser beam P1 was 0 mJ, ions having high ion energy were generated as in the comparative example. The case in which the pulse energy E1 of the first pre-pulse laser beam P1 is 0 mJ corresponds to a case in which the target 27 is not irradiated with the first pre-pulse laser beam P1 but is irradiated with the second pre-pulse laser beam P2.

As illustrated in FIG. 8A, the ion energy of generated ions tends to decrease as the pulse energy E1 of the first pre-pulse laser beam P1 is increased in the following order.

Reference sign 010: E1=0.010 mJ
Reference sign 017: E1=0.017 mJ
Reference sign 025: E1=0.025 mJ
Reference sign 050: E1=0.050 mJ
Reference sign 078: E1=0.078 mJ
Reference sign 144: E1=0.144 mJ However, as indicated by Reference sign 267, when the pulse energy E1 of the first pre-pulse laser beam P1 was 0.267 mJ, the ion energy of generated ions is higher than in the cases of Reference signs 050, 078, and 144.

Figure 8B:
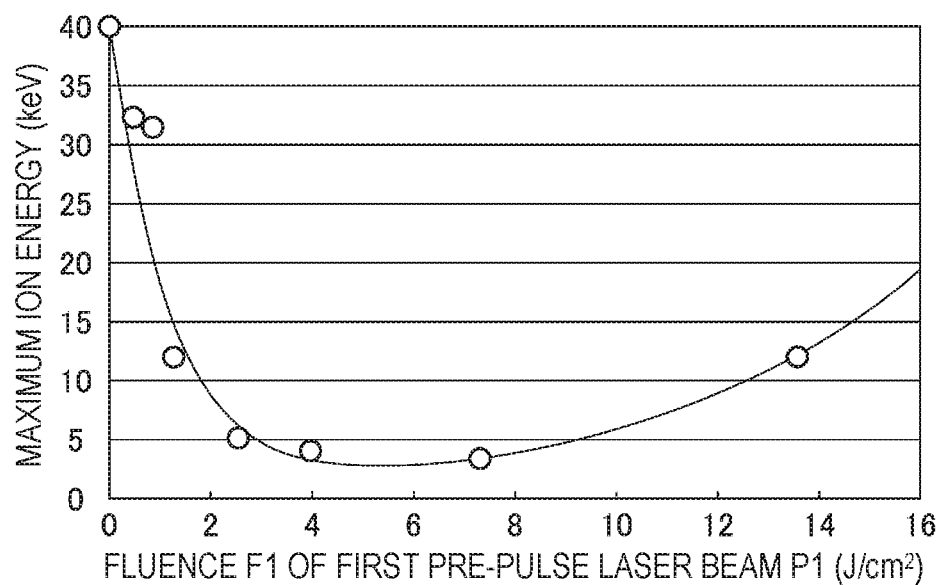
FIG. 8B is a graph illustrating the relation between the fluence of the first pre-pulse laser beam at a focal point and the maximum ion energy in the first embodiment.

FIG. 8B is a graph illustrating the relation between a fluence F1 of the first pre-pulse laser beam P1 in the first embodiment at the focal point and the maximum ion energy. The graph in FIG. 8B is produced by converting the pulse energy E1 of the first pre-pulse laser beam P1 in the result illustrated in FIG. 8A into the fluence F1 and extracting the relation between the pulse energy E1 and the maximum ion energy.

As illustrated in FIG. 8B, the maximum ion energy can be reduced by irradiating the target 27 with the first pre-pulse laser beam P1 as compared to a case in which the target 27 is not irradiated with the first pre-pulse laser beam P1.

In addition, as illustrated with an approximate curve in FIG. 8B, the maximum ion energy can be reduced to 20 keV or less by setting the fluence F1 of the first pre-pulse laser beam P1 at the focal point to be 1.5 $J/cm^2$ to 16 $J/cm^2$ inclusive.

In addition, the maximum ion energy can be reduced to 10 keV or less by setting the fluence F1 of the first pre-pulse laser beam P1 at the focal point to be 1.8 $J/cm^2$ to 13 $J/cm^2$ inclusive.

In addition, the maximum ion energy can be reduced to 5 keV or less by setting the fluence F1 of the first pre-pulse laser beam P1 at the focal point to be 3 $J/cm^2$ to 9 $J/cm^2$ inclusive.

In this manner, according to the first embodiment, the ion energy generated when the target 27 is irradiated with the first and second pre-pulse laser beams P1 and P2 can be reduced. Accordingly, degradation of the multi-layer reflective film of the EUV condensation mirror 23 and decrease of the reflectance thereof can be reduced.

A fluence F2 of the second pre-pulse laser beam P2 at the focal point is preferably 2 to 100 times larger than the fluence F1 of the first pre-pulse laser beam P1 at the focal point. In addition, the maximum ion energy is lowest for irradiation conditions denoted by Reference sign 078 and Reference sign 144, and thus the fluence F2 is preferably 5 to 10 times larger than the fluence F1.

3.3.2 Conversion Efficiency (CE)

Figure 9:
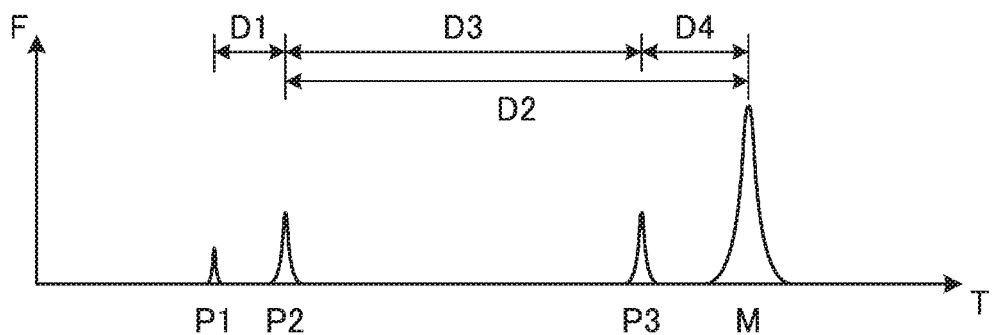
FIG. 9 is a pulse waveform diagram illustrating exemplary irradiation conditions of first to third pre-pulse laser beams and the main pulse laser beam in the first embodiment.

FIG. 9 is a pulse waveform diagram illustrating exemplary irradiation conditions of the first to third pre-pulse laser beams P1 to P3 and the main pulse laser beam M in the first embodiment.

The pulse energy E1 of the first pre-pulse laser beam P1 was 0.14 mJ.

The pulse energy E2 of the second pre-pulse laser beam P2 was 0.8 mJ.

The pulse energy of the third pre-pulse laser beam P3 was 3 mJ.

The delay times D1, D2, and D4 between pulses were set as follows.

The first delay time D1 was 10 ns.
The second delay time D2 was 1.4 μs.
The fourth delay time D4 was 0.1 μs.

Accordingly, the third delay time D3 was calculated to be 1.3 μs by subtracting the fourth delay time D4 from the second delay time D2.

Figure 10:
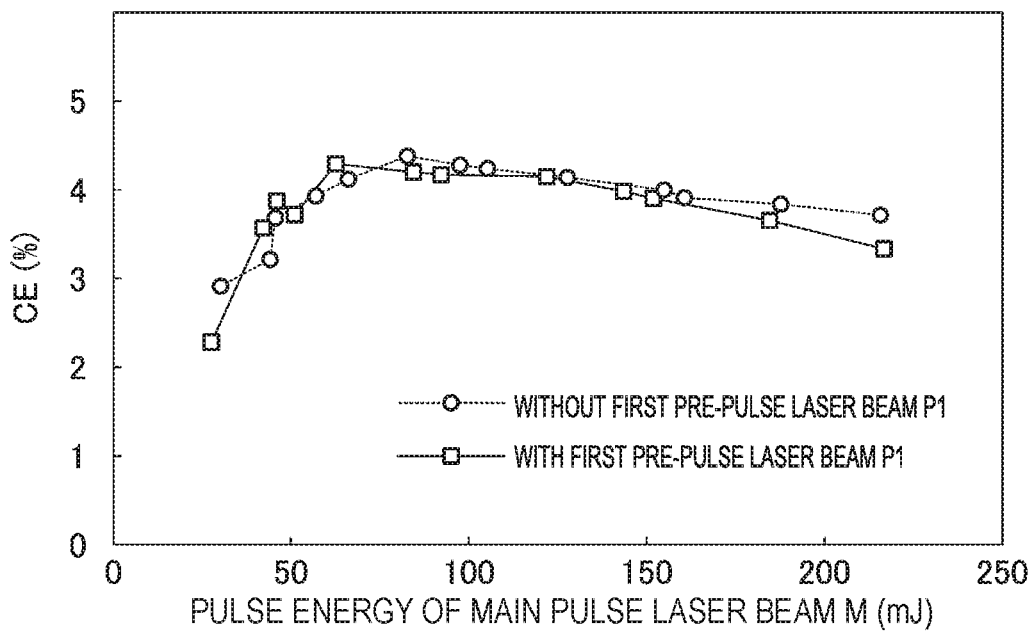
FIG. 10 is a graph illustrating conversion efficiency (CE) from the energies of the first to third pre-pulse laser beams and the main pulse laser beam into the energy of EUV light in the first embodiment.

FIG. 10 is a graph illustrating conversion efficiency (CE) from the energies of the first to third pre-pulse laser beams P1 to P3 and the main pulse laser beam M into the energy of EUV light in the first embodiment. FIG. 10 illustrates, as a comparative example, the CE in a case of no irradiation with the first pre-pulse laser beam P1.

As illustrated in FIG. 10, according to the first embodiment, the CE comparable to that in the comparative example can be obtained.

Figure 11:
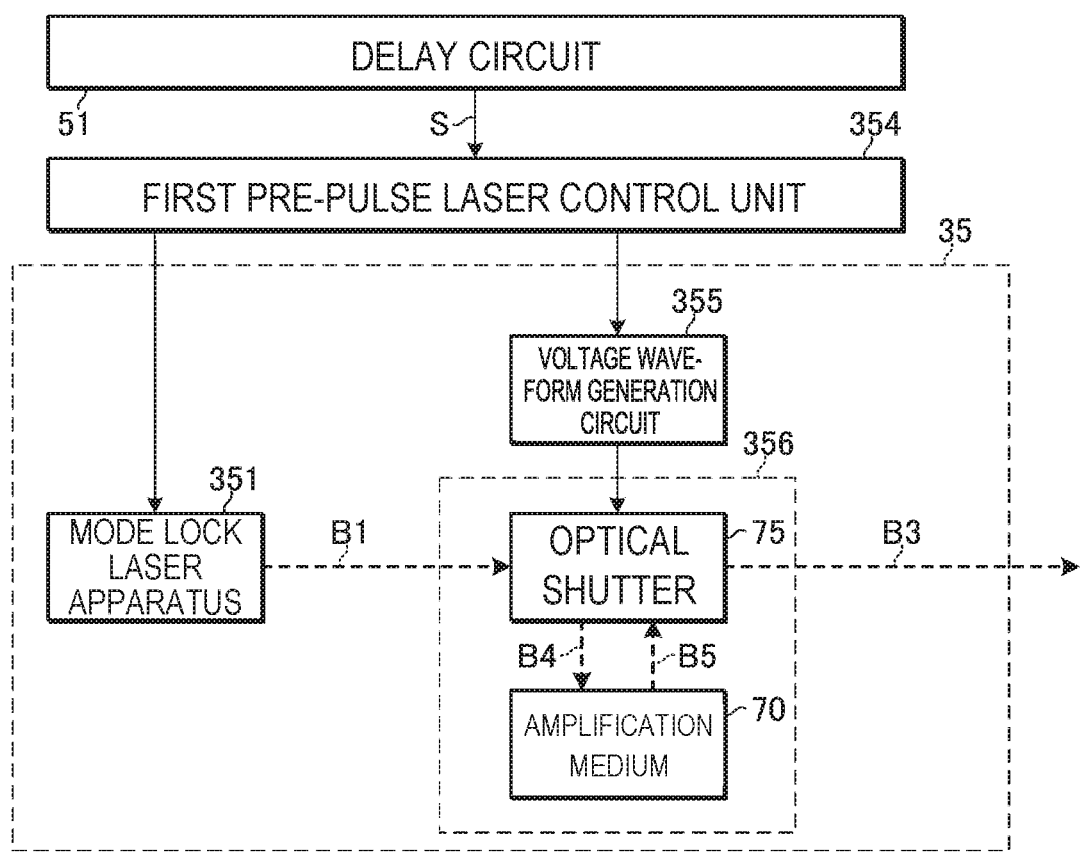
FIG. 11 is a block diagram illustrating the configuration of the first pre-pulse laser in a first modification of the first embodiment.

3.4 First Pre-Pulse Laser Including Regenerative Amplifier
3.4.1 Configuration FIG. 11 is a block diagram illustrating the configuration of the first pre-pulse laser 35 in a first modification of the first embodiment. In the first modification, a regenerative amplifier 356 is used in place of the optical shutter 352 and the amplifier 353 illustrated in FIG. 7A. The regenerative amplifier 356 includes an amplification medium 70 and an optical shutter 75.

Any other feature of the configuration of the first pre-pulse laser 35 in the first modification is same as that described with reference to FIG. 7A.

The regenerative amplifier 356 is an exemplary optical device configured to generate first and second pre-pulse laser beams from at least one pulse of a plurality of pulses output from a mode lock laser apparatus.

Figure 12:
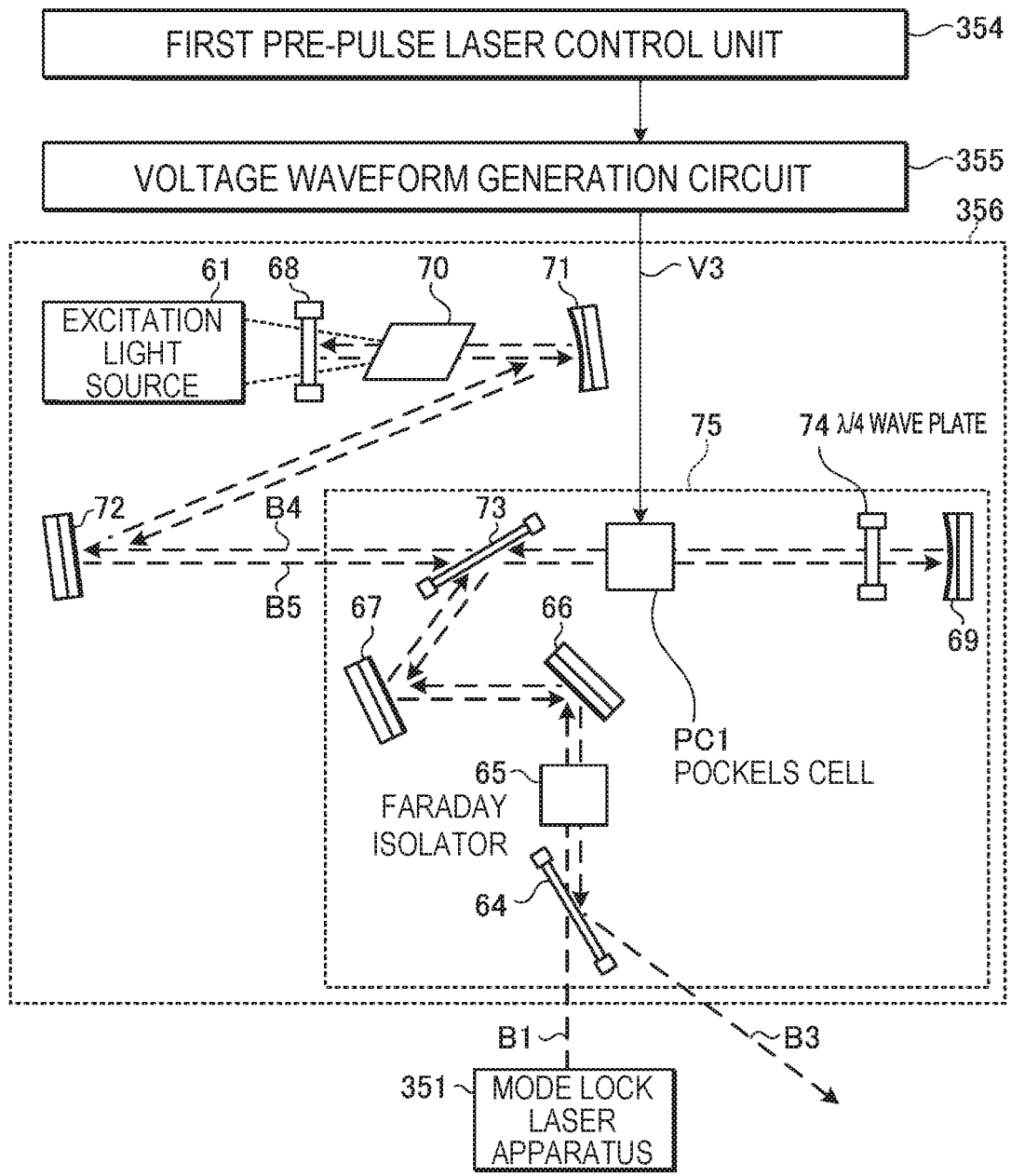
FIG. 12 illustrates the configuration of a regenerative amplifier in the first modification of the first embodiment.

FIG. 12 illustrates the configuration of the regenerative amplifier 356 in the first modification of the first embodiment. The regenerative amplifier 356 includes an optical resonator configured by a planar mirror 68 and a concave mirror 69. The amplification medium 70, a concave mirror 71, a planar mirror 72, a polarization beam splitter 73, a pockels cell PC1, and a λ/4 wave plate 74 are disposed on the optical path of the optical resonator in this order from the planar mirror 68 side. The amplification medium 70 is, for example, Nd:YAG crystal. The pockels cell PC1 corresponds to an optical element configured to control pulse confinement to the optical resonator and pulse extraction from the optical resonator. The regenerative amplifier 356 also includes an excitation light source 61 for introducing excitation light from the outside of the optical resonator into the amplification medium 70. In addition, the regenerative amplifier 356 includes a polarization beam splitter 64, a Faraday isolator 65, a planar mirror 66, and a planar mirror 67. The Faraday isolator 65 includes a Faraday rotator (not illustrated) and a λ/2 wave plate (not illustrated).

The optical shutter 75 is configured by the polarization beam splitter 73, the pockels cell PC1, the λ/4 wave plate 74, the concave mirror 69, the polarization beam splitter 64, the Faraday isolator 65, the planar mirror 66, and the planar mirror 67.

3.4.2 Operation

The polarization beam splitter 64 transmits the pulse laser beam B1, which is linearly polarized light having a polarization direction parallel to the sheet, at high transmittance. In addition, the polarization beam splitter 64 reflects a pulse laser beam that is linearly polarized light having a polarization direction orthogonal to the sheet at high reflectance as described later.

The pulse laser beam B1 includes a first polarization component and a second polarization component orthogonal to each other. The direction of a resultant vector of the first and second polarization components is aligned with the polarization direction of the pulse laser beam B1 and is parallel to the sheet.

The Faraday isolator 65 shifts the phase of the second polarization component of the pulse laser beam B1 incident from the lower side in FIG. 12 relative to the phase of the first polarization component thereof by ½ of the wavelength and transmits the pulse laser beam B1. Accordingly, the Faraday isolator 65 rotates the polarization direction of the pulse laser beam B1 as linearly polarized light by 90° and transmits the pulse laser beam B1. In addition, the Faraday isolator 65 transmits a pulse laser beam incident from the upper side in FIG. 12 without changing the phase difference between the first and second polarization components of the pulse laser beam as described later. In other words, the Faraday isolator 65 transmits a pulse laser beam incident from the upper side in FIG. 12 without rotating the polarization direction of the pulse laser beam.

The polarization beam splitter 73 disposed in the optical resonator reflects a pulse laser beam that is linearly polarized light having a polarization direction orthogonal to the sheet at high reflectance. In addition, the polarization beam splitter 73 transmits a pulse laser beam that is linearly polarized light having a polarization direction parallel to the sheet at high transmittance as described later.

Voltage V3 can be applied to the pockels cell PC1 by the voltage waveform generation circuit 355. While the voltage V3 is not applied, the pockels cell PC1 transmits a pulse laser beam without changing the phase difference between the first and second polarization components of the pulse laser beam. While the voltage V3 is applied, the pockels cell PC1 shifts the phase of the second polarization component of a pulse laser beam relative to the phase of the first polarization component thereof by ¼ of the wavelength and transmits the pulse laser beam. An electric optical element or an acoustic optical element having the same function may be used in place of the pockels cell PC1.

The λ/4 wave plate 74 shifts the phase of the second polarization component of a pulse laser beam relative to the phase of the first polarization component thereof by ¼ of the wavelength and transmits the pulse laser beam.

3.4.2.1 Case in Which Voltage V3 is Not Applied to Pockels Cell PC1

A pulse laser beam incident from the Faraday isolator 65 on the optical resonator through the planar mirrors 66 and 67 and the polarization beam splitter 73 is squarely reflected by the concave mirror 69 and returned to the polarization beam splitter 73. In this case, the pulse laser beam transmits through each of the pockels cell PC1 and the λ/4 wave plate 74 twice. When the voltage V3 is not applied to the pockels cell PC1, the phase of the second polarization component is shifted relative to the phase of the first polarization component by ½ of the wavelength in total. Thus, the polarization direction of the pulse laser beam is rotated by 90°, and the pulse laser beam is incident on the polarization beam splitter 73 as a pulse laser beam that is linearly polarized light having a polarization direction parallel to the sheet. The polarization beam splitter 73 transmits the pulse laser beam that is linearly polarized light having a polarization direction parallel to the sheet at high transmittance.

A pulse laser beam B4 having transmitted through the polarization beam splitter 73 is amplified by the amplification medium 70 while being squarely reflected by the planar mirror 68 and returned to the polarization beam splitter 73 as a pulse laser beam B5.

The pulse laser beam B5 transmits through the polarization beam splitter 73 at high transmittance. The pulse laser beam having transmitted through the polarization beam splitter 73 is squarely reflected by the concave mirror 69 and returned to the polarization beam splitter 73. In this case, when the voltage V3 is not applied to the pockels cell PC1, the polarization direction of the pulse laser beam is rotated by 90°, and the pulse laser beam is incident on the polarization beam splitter 73 as a pulse laser beam that is linearly polarized light having a polarization direction orthogonal to the sheet. The polarization beam splitter 73 reflects the pulse laser beam that is linearly polarized light having a polarization direction orthogonal to the sheet at high reflectance.

As described above, when the voltage V3 is not applied to the pockels cell PC1, the pulse laser beam is output from the optical resonator after only one round trip inside the optical resonator.

The pulse laser beam output from the optical resonator is incident on the Faraday isolator 65 from the upper side in FIG. 12. The Faraday isolator 65 transmits the linearly polarized pulse laser beam incident from the upper side in FIG. 12 without rotating the polarization direction thereof. The polarization beam splitter 64 reflects the pulse laser beam that is linearly polarized light having a polarization direction orthogonal to the sheet at high reflectance.

The pulse laser beam B3 reflected by the polarization beam splitter 64 is guided to the plasma generation region 25 through the laser beam condensation optical system 22a illustrated in FIG. 6. However, the pulse laser beam B3, which is output after only one round trip inside the optical resonator of the regenerative amplifier 356, has such a weak intensity that the pulse laser beam B3 does not diffuse the target 27 nor generate plasma from the target 27 when incident on the target 27.

3.4.2.2 Case in Which Voltage V3 is Applied to Pockels Cell PC1

The voltage waveform generation circuit 355 may change the voltage V3 applied to the pockels cell PC1 from "OFF" to "ON" after the pulse laser beam B4 is emitted from the polarization beam splitter 73 and before the pulse laser beam B4 is returned to the polarization beam splitter 73 as the pulse laser beam B5. While the voltage V3 is applied, the pockels cell PC1 shifts the phase of the second polarization component of a pulse laser beam relative to the phase of the first polarization component thereof by ¼ of the wavelength and transmits the pulse laser beam.

A pulse laser beam having transmitted through the polarization beam splitter 73 from the left side in FIG. 12 is squarely reflected by the concave mirror 69 and returned to the polarization beam splitter 73. In this case, the polarization direction of the pulse laser beam is rotated by 90° as the pulse laser beam transmits through the λ/4 wave plate 74 twice, and the polarization direction is further rotated by 90° as the pulse laser beam transmits through the pockels cell PC1 to which the voltage V3 is applied twice. Accordingly, a pulse laser beam that is linearly polarized light having a polarization direction parallel to the sheet is incident on the polarization beam splitter 73. The pulse laser beam that is linearly polarized light having a polarization direction parallel to the sheet transmits through the polarization beam splitter 73 again and is amplified by the amplification medium 70. While the voltage V3 is applied to the pockels cell PC1, pulse confinement to the optical resonator is maintained and amplification operation is repeated.

After the amplification operation is repeated, the voltage waveform generation circuit 355 may change the voltage V3 applied to the pockels cell PC1 from "ON" to "OFF" before the pulse laser beam B4 emitted from the polarization beam splitter 73 is returned to the polarization beam splitter 73 as the pulse laser beam B5.

A pulse laser beam having transmitted through the polarization beam splitter 73 from the left side in FIG. 12 is squarely reflected by the concave mirror 69 and returned to the polarization beam splitter 73. When the voltage V3 is not applied to the pockels cell PC1, the polarization direction of the pulse laser beam is rotated by 90°, and the pulse laser beam is incident on the polarization beam splitter 73 as a pulse laser beam that is linearly polarized light having a polarization direction orthogonal to the sheet. The polarization beam splitter 73 reflects the pulse laser beam that is linearly polarized light having a polarization direction orthogonal to the sheet at high reflectance. In this manner, pulses are extracted from the optical resonator.

While the voltage V3 is applied to the pockels cell PC1 and the amplification operation is repeated, the pulse laser beam B1 newly output from the mode lock laser apparatus 351 is incident on the optical resonator as a pulse laser beam that is linearly polarized light having a polarization direction orthogonal to the sheet, and is incident on the pockels cell PC1. The polarization direction of the pulse laser beam is rotated by 90° as the pulse laser beam transmits through the λ/4 wave plate 74 twice, and the polarization direction is further rotated by 90° as the pulse laser beam transmits through the pockels cell PC1 to which the voltage V3 is applied twice. Then, the pulse laser beam is incident on the polarization beam splitter 73 as a pulse laser beam that is linearly polarized light having a polarization direction orthogonal to the sheet. Thus, the pulse laser beam is reflected by the polarization beam splitter 73 and output out of the optical resonator without being amplified.

3.4.2.3 Generation of First and Second Pre-Pulse Laser Beams

Figure 13A:
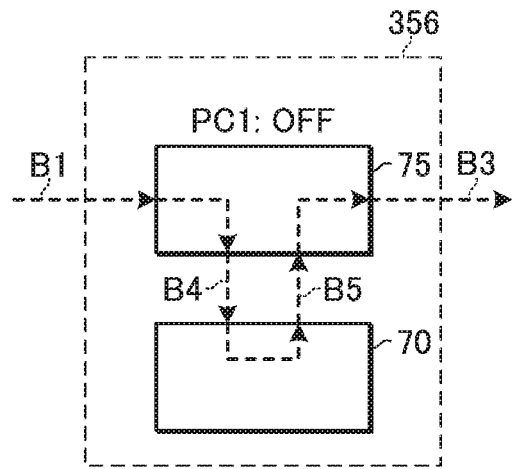
FIGS. 13A and 13B simply illustrate the function of an optical shutter in the first modification of the first embodiment.
Figure 13B:
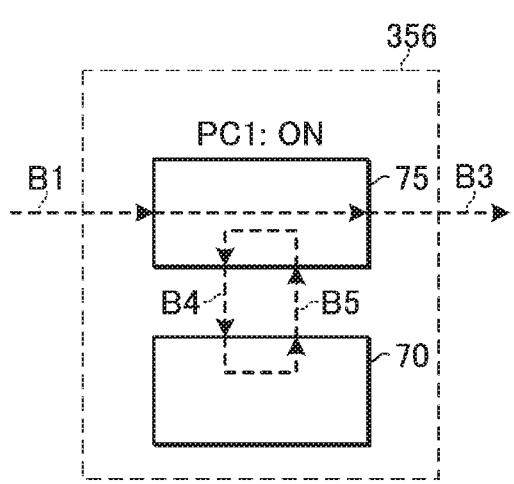

FIGS. 13A and 13B simply illustrate the function of the optical shutter 75 in the first modification of the first embodiment. While the voltage V3 is not applied to the pockels cell PC1 (PC1:OFF), the pulse laser beam B1 is output from the regenerative amplifier 356 as the pulse laser beam B3 after only one round trip as the pulse laser beams B4 and B5 in the optical resonator including the amplification medium 70.

When the voltage V3 applied to the pockels cell PC1 is switched from "OFF" to "ON" after the pulse laser beam B4 is emitted from the optical shutter 75 and before the pulse laser beam B4 is returned as the pulse laser beam B5 (PC1:ON), pulses are confined to the optical resonator and repeatedly amplified by the amplification medium 70. In this case, the pulse laser beam B1 that is newly incident is output from the regenerative amplifier 356 as the pulse laser beam B3 without being amplified by the amplification medium 70. When the voltage V3 applied to the pockels cell PC1 is switched from "ON" to "OFF" (PC1:OFF), the pulses confined to the optical resonator are extracted through the optical shutter 75 and output from the regenerative amplifier 356 as the pulse laser beam B3. The state in which the voltage V3 is applied to the pockels cell PC1 (PC1:ON) corresponds to a first state in which pulse confinement to the optical resonator is performed. The state in which the voltage V3 is not applied to the pockels cell PC1 (PC1:OFF) corresponds to a second state in which pulse extraction from the optical resonator is performed.

Figure 13C:
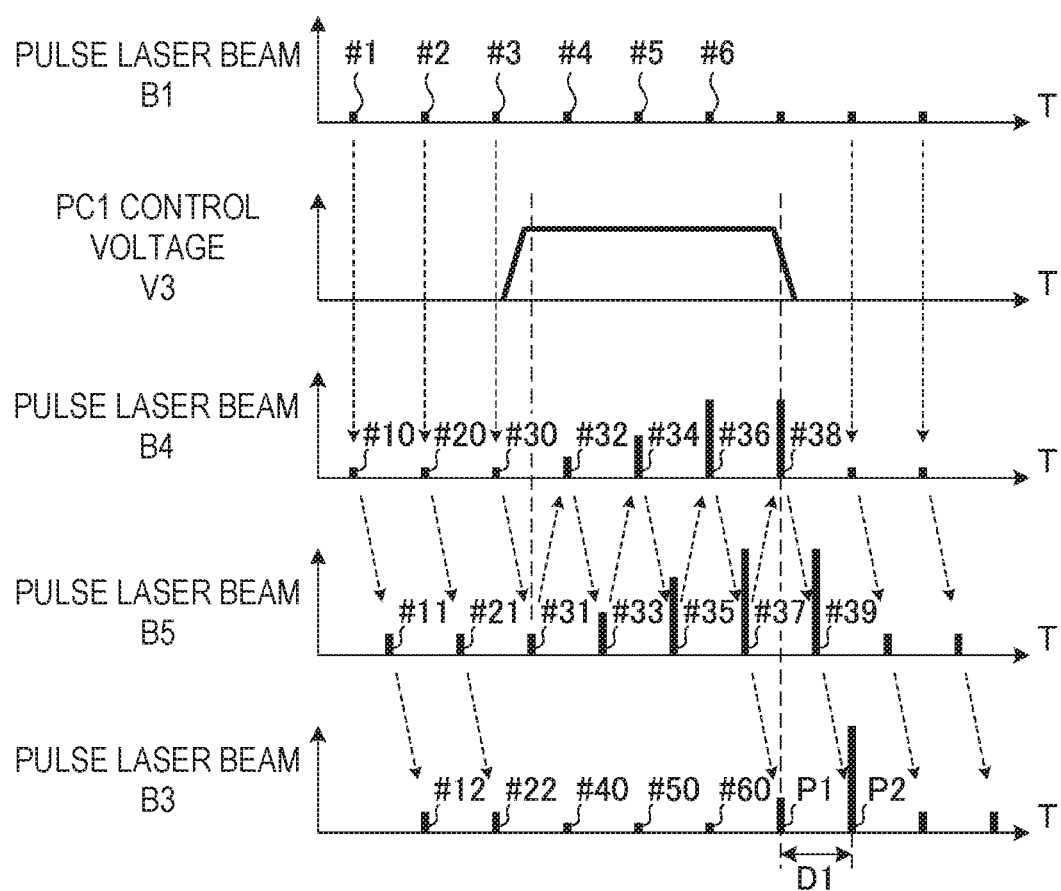
FIG. 13C is a time chart illustrating the process of generating the first and second pre-pulse laser beams in the first modification of the first embodiment.

FIG. 13C is a time chart illustrating the process of generating the first and second pre-pulse laser beams P1 and P2 in the first modification of the first embodiment. In FIG. 13C, the horizontal axis represents time T. The vertical axis represents signal strength or pulse laser beam energy.

The pulse laser beam B1 is periodically output from the mode lock laser apparatus 351.

While the voltage V3 is not applied to the pockels cell PC1 (PC1:OFF), Pulse #1 included in the pulse laser beam B1 is emitted from the optical shutter 75 as Pulse #10 of the pulse laser beam B4. This pulse is amplified by the amplification medium 70, returned to the optical shutter 75 as Pulse #11 of the pulse laser beam B5, and output from the regenerative amplifier 356 as Pulse #12 of the pulse laser beam B3. Pulse #2 passes through a path same as that of Pulse #1 and is output as Pulse #22 of the pulse laser beam B3.

Pulse #3 included in the pulse laser beam B1 is emitted from the optical shutter 75 as Pulse #30 of the pulse laser beam B4. To confine this pulse to the optical resonator, rise of the voltage V3 is completed (PC1:ON) before Pulse #30 is returned to the optical shutter 75 as Pulse #31 of the pulse laser beam B5. Accordingly, this pulse is emitted again from the optical shutter 75 as Pulse #32 of the pulse laser beam B4. Thereafter, the pulse is amplified through round trips inside the optical resonator as Pulses #33, #34, #35, #36, and #37.

While the voltage V3 is applied to the pockels cell PC1 (PC1:ON), Pulses #4, #5, and #6 of the pulse laser beam B1 incident on the optical shutter 75 are output from the regenerative amplifier 356 as Pulses #40, #50, and #60 of the pulse laser beam B3 without being amplified.

In the first modification of the first embodiment, the voltage V3 applied to the pockels cell PC1 is switched from "ON" to "OFF" in synchronization as Pulse #37 of the pulse laser beam B5 returned from the amplification medium 70 to the optical shutter 75 passes through the pockels cell PC1. More specifically, the timing of fall of the voltage V3 is adjusted so that Pulse #37 passes through the pockels cell PC1 halfway through fall of the voltage V3. The timing of fall of the voltage V3 may be controlled, for example, based on a result of detection by a light detector (not illustrated).

Accordingly, part of Pulse #37 is output from the regenerative amplifier 356 as the pulse laser beam B3. This pulse laser beam B3 corresponds to the first pre-pulse laser beam P1. However, the other part of Pulse #37 is not output as the pulse laser beam B3 but remains inside the optical resonator as Pulse #38 of the pulse laser beam B4. Pulse #38 is further amplified by the amplification medium 70 and returned to the optical shutter 75 as Pulse #39 of the pulse laser beam B5. In this case, when the voltage V3 is not applied to the pockels cell PC1 (PC1:OFF), Pulse #39 is output from the regenerative amplifier 356 as the pulse laser beam B3. This pulse laser beam B3 corresponds to the second pre-pulse laser beam P2.

3.4.3 Effect

According to the first modification, a pulse energy ratio of the first and second pre-pulse laser beams P1 and P2 can be changed by finely adjusting a timing at which Pulse #37 passes through the pockels cell PC1 halfway through fall of the voltage V3.

The output timing difference between the first and second pre-pulse laser beams P1 and P2 depends on the resonator length of the optical resonator included in the regenerative amplifier 356. For example, the output timing difference is 10 ns assuming that the resonator length of the optical resonator is 1.5 m, the speed of light in vacuum is $3 \times 10^8$ m/s, and the refractive index in the optical path is one. The output timing difference substantially corresponds to the first delay time D1.

3.5 Regenerative Amplifier Including Two Pockels Cells 3.5.1 Configuration

Figure 14:
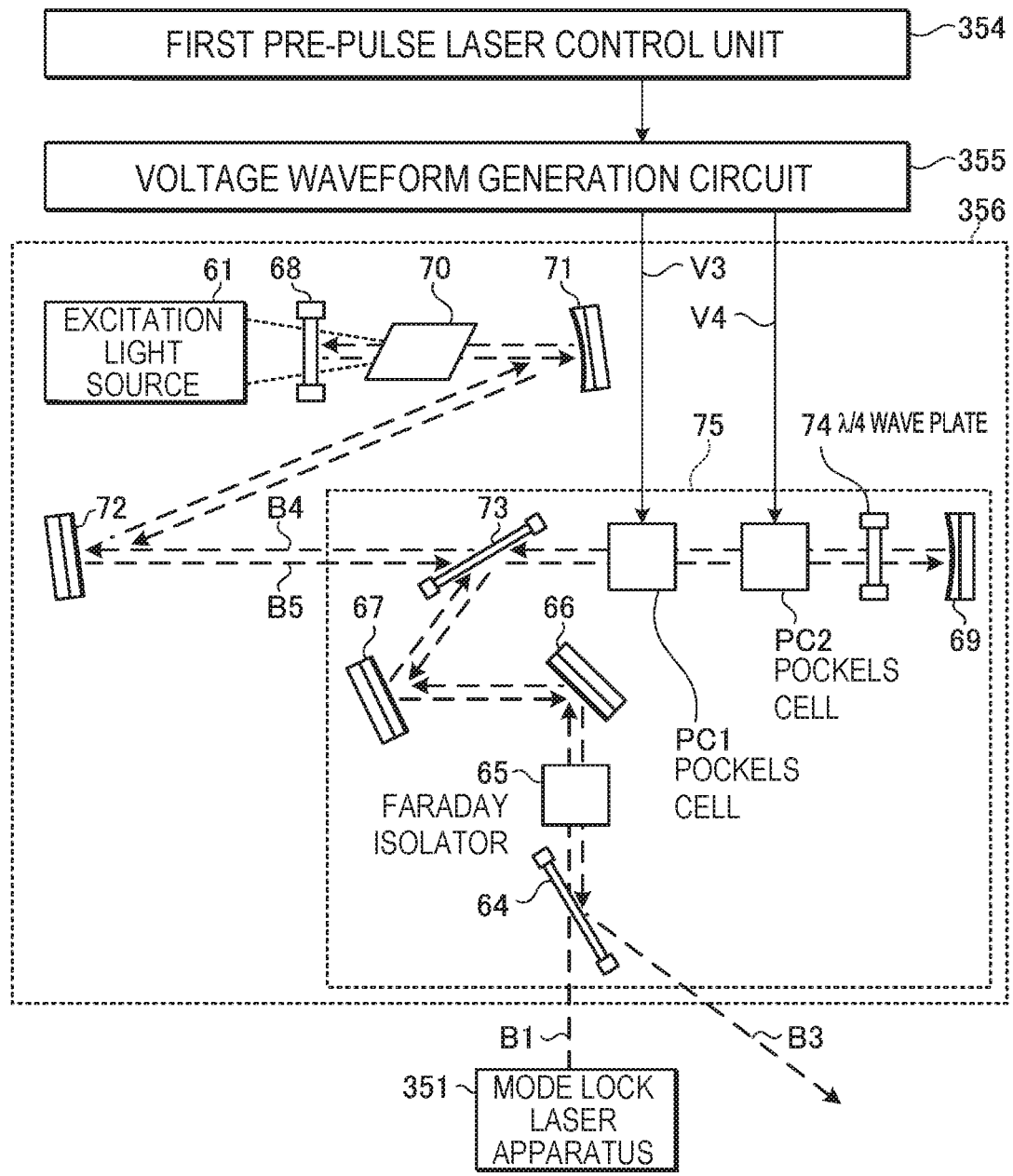
FIG. 14 illustrates the configuration of the regenerative amplifier in a second modification of the first embodiment.

FIG. 14 illustrates the configuration of the regenerative amplifier 356 in a second modification of the first embodiment. In the second modification, the regenerative amplifier 356 includes another pockels cell PC2 between the concave mirror 69 and the polarization beam splitter 73. The pockels cells PC1 and PC2 correspond to first and second optical elements configured to control pulse confinement to the optical resonator and pulse extraction from the optical resonator.

Voltage V4 can be applied to the pockels cell PC2 by the voltage waveform generation circuit 355. While the voltage V4 is not applied, the pockels cell PC2 transmits a pulse laser beam without changing the phase difference between the first and second polarization components of the pulse laser beam. Thus, operation of the regenerative amplifier 356 in the second modification is same as that in the first modification when the voltage V4 is not applied to the pockels cell PC2.

While the voltage V4 is applied, the pockels cell PC2 shifts the phase of the second polarization component of a pulse laser beam relative to the phase of the first polarization component thereof and transmits the pulse laser beam. The amount of phase shift provided to these polarization components can be changed by changing the value of the voltage V4.

Any other feature of the configuration of the second modification is same as that of the first modification described with reference to FIG. 12.

3.5.2 Operation

Figure 15A:
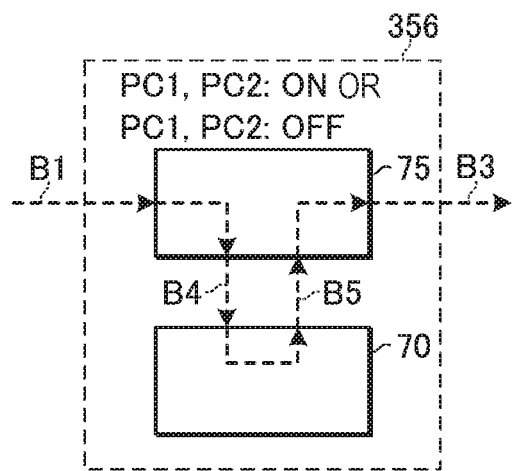
FIGS. 15A and 15B simply illustrate the function of the optical shutter in the second modification of the first embodiment.
Figure 15B:
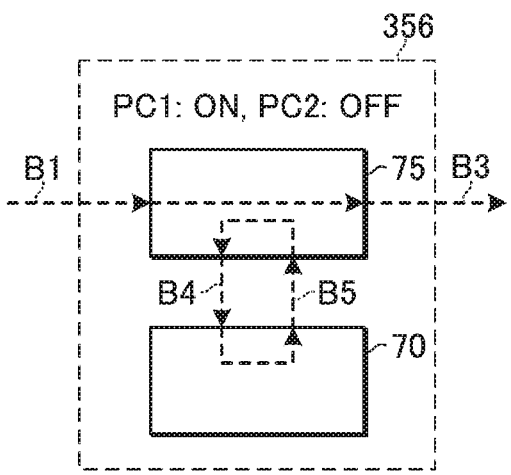

FIGS. 15A and 15B simply illustrate the function of the optical shutter 75 in the second modification of the first embodiment. While the voltage V4 is not applied to the pockels cell PC2 (PC2:OFF), the function of the optical shutter 75 is same as the function of the optical shutter 75 in the first modification described with reference to FIGS. 13A and 13B.

When the voltage V4 equal to the voltage V3 is applied to the pockels cell PC2 (PC2:ON), the pockels cell PC2 shifts the phase of the second polarization component of a pulse laser beam relative to the phase of the first polarization component thereof by ¼ of the wavelength and transmits the pulse laser beam. Thus, the operation of the optical shutter 75 when the voltages of both pockels cells PC1 and PC2 are set to "ON" (PC1:ON and PC2:ON) is same as the operation of the optical shutter 75 when the voltages of both pockels cells PC1 and PC2 are set to "OFF" (PC1:OFF and PC2:OFF).

Figure 15C:
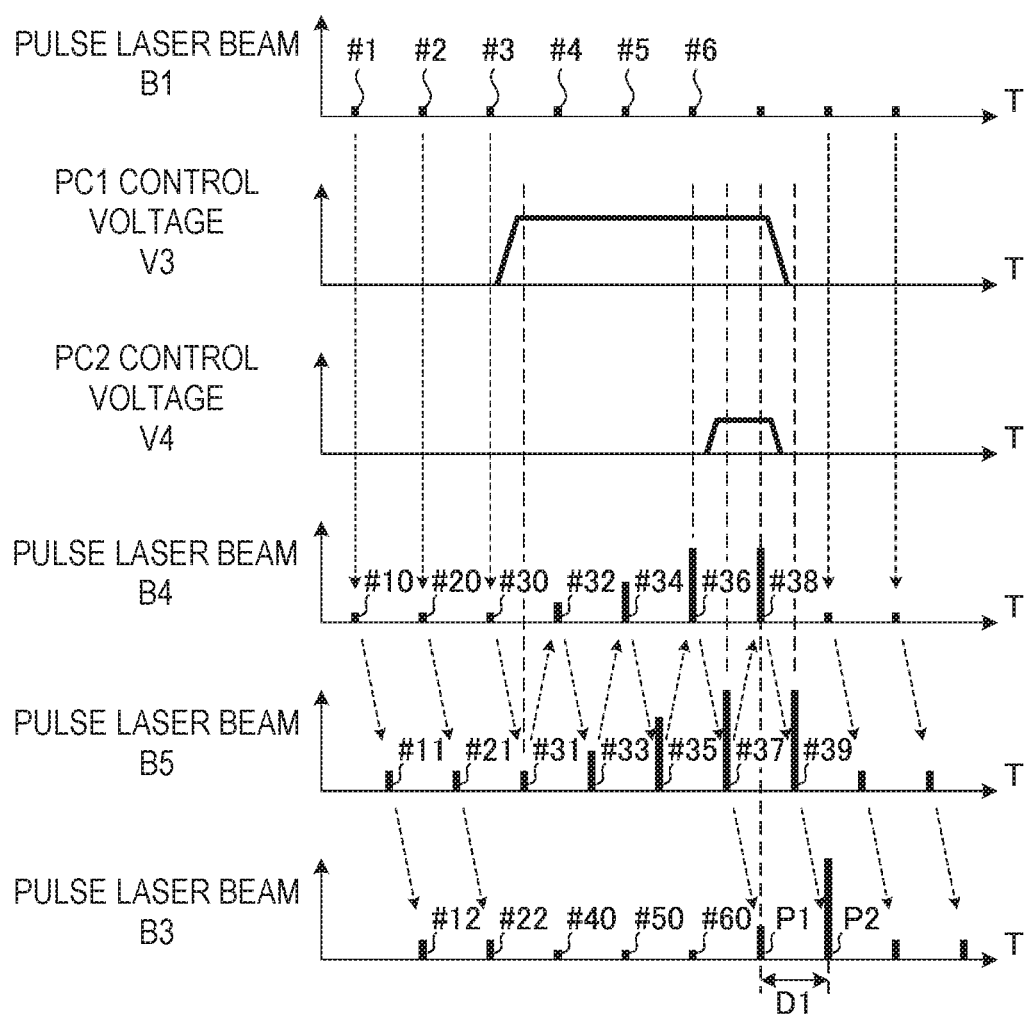
FIG. 15C is a time chart illustrating the process of generating the first and second pre-pulse laser beams in the second modification of the first embodiment.

FIG. 15C is a time chart illustrating the process of generating the first and second pre-pulse laser beams P1 and P2 in the second modification of the first embodiment. In FIG. 15C, the horizontal axis represents time T. The vertical axis represents signal strength or pulse laser beam energy.

When the voltage V4 is not applied to the pockels cell PC2 (PC2:OFF), the operation of the optical shutter 75 in the second modification is same as that in the first modification. The voltage V3 is applied to the pockels cell PC1 (PC1:ON) to confine Pulse #3 included in the pulse laser beam B1 to the optical resonator.

In the second modification, the voltage V4 is risen to a predetermined value after Pulse #36 of the pulse laser beam B4 is emitted from the optical shutter 75 and before the pulse is returned to the optical shutter 75 as Pulse #37 of the pulse laser beam B5. The predetermined value of the voltage V4 is higher than zero and lower than the voltage V3.

Accordingly, part of Pulse #37 is output from the regenerative amplifier 356 as the pulse laser beam B3. This pulse laser beam B3 corresponds to the first pre-pulse laser beam P1. However, the other part of Pulse #37 is not output as the pulse laser beam B3 but remains inside the optical resonator as Pulse #38 of the pulse laser beam B4. Pulse #38 is further amplified by the amplification medium 70 and returned to the optical shutter 75 as Pulse #39 of the pulse laser beam B5.

Application of both voltages V3 and V4 is canceled (PC1:OFF and PC2:OFF) after Pulse #38 of the pulse laser beam B4 is emitted from the optical shutter 75 and before the pulse is returned to the optical shutter 75 as Pulse #39 of the pulse laser beam B5. Accordingly, Pulse #39 is extracted from the optical resonator as the pulse laser beam B3 and output from the regenerative amplifier 356. This pulse laser beam B3 corresponds to the second pre-pulse laser beam P2.

Alternatively, application of the voltage V4 may be canceled but application of the voltage V3 may be kept (PC1:ON and PC2:OFF) after Pulse #38 of the pulse laser beam B4 is emitted from the optical shutter 75 and before the pulse is returned to the optical shutter 75 as Pulse #39 of the pulse laser beam B5. In this case, Pulse #39 remains inside the optical resonator and is further amplified. Thereafter, this pulse can be output from the regenerative amplifier 356 as the pulse laser beam B3 by canceling application of the voltage V3 (PC1:OFF and PC2:OFF). This pulse laser beam B3 corresponds to the second pre-pulse laser beam P2.

3.5.3 Effect

According to the second modification, the pulse energy ratio of the first and second pre-pulse laser beams P1 and P2 can be changed by adjusting the value of the voltage V4. The control of the value of the voltage V4 in the second modification is likely to be stabilized as compared to the control of the timing of fall of the voltage V3 in the first modification, and thus the pulse energy ratio can be stabilized.

3.6 First Pre-Pulse Laser Including Delay Optical Path 3.6.1 Configuration

Figure 16A:
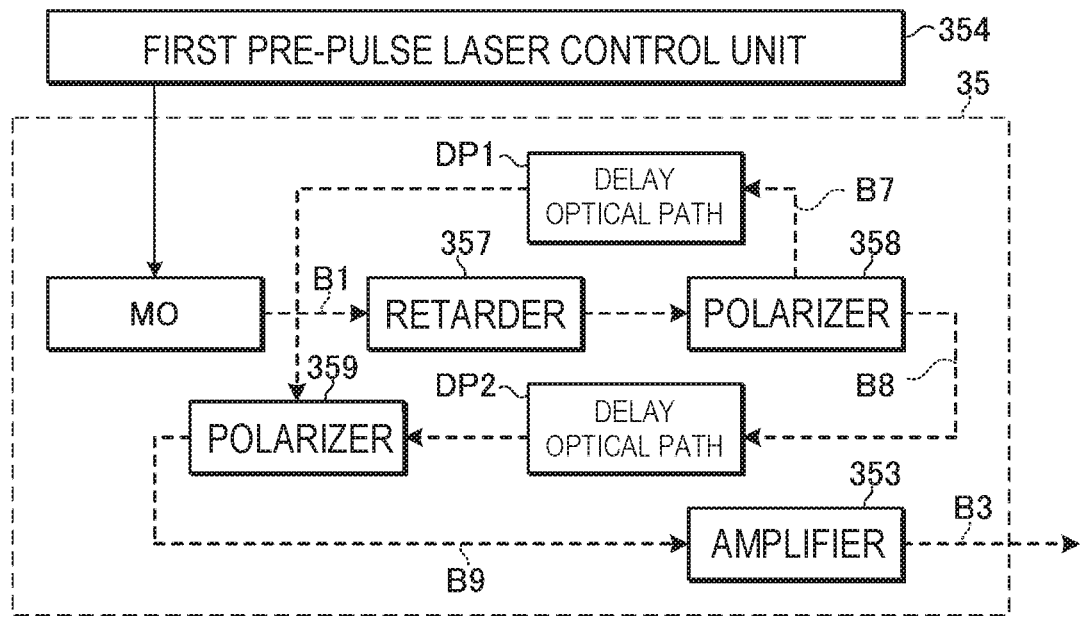
FIG. 16A is a block diagram illustrating the configuration of the first pre-pulse laser in a third modification of the first embodiment.

FIG. 16A is a block diagram illustrating the configuration of the first pre-pulse laser 35 in a third modification of the first embodiment. The first pre-pulse laser 35 in the third modification includes a master oscillator MO, a retarder 357, two polarizers 358 and 359, and the amplifier 353.

The master oscillator MO is a laser apparatus configured to output the pulse laser beam B1 having a pulse time width in the order of picoseconds. The retarder 357 includes, for example, a λ/2 wave plate. When the direction of the optical axis of crystal included in the retarder 357 is tilted by θ relative to the polarization direction of the pulse laser beam B1 output from the master oscillator MO, the retarder 357 rotates the polarization direction of the pulse laser beam B1 by 2θ and emits the pulse laser beam B1. The pulse laser beam emitted from the retarder 357 includes a first polarization component and a second polarization component orthogonal to each other. The ratio of the first and second polarization components differs in accordance with the polarization direction of the pulse laser beam emitted from the retarder 357.

The polarizers 358 and 359 each include for example, a polarization beam splitter. The polarizers 358 and 359 each reflect the first polarization component at high reflectance and transmit the second polarization component at high transmittance. Accordingly, the polarizer 358 bifurcates the pulse laser beam emitted from the retarder 357 into a pulse laser beam B7 including the first polarization component and a pulse laser beam B8 including the second polarization component. The polarizer 359 merges the pulse laser beam B7 and the pulse laser beam B8 and emits the merged pulse laser beams as a pulse laser beam B9. The optical path of the pulse laser beam B7 between the polarizer 358 and the polarizer 359 includes a delay optical path DP1. The optical path of the pulse laser beam B8 between the polarizer 358 and the polarizer 359 includes a delay optical path DP2 longer than the delay optical path DP1. The polarizer 358 corresponds to a first polarizer of the present disclosure, and the polarizer 359 corresponds to a second polarizer of the present disclosure. The delay optical path DP1 corresponds to a first delay optical path of the present disclosure, and the delay optical path DP2 corresponds to a second delay optical path of the present disclosure.

The present invention is not limited thereto, but an alternative configuration in which the delay optical path DP1 is longer than the delay optical path DP2 may be employed. In this alternative configuration, the delay optical path DP1 corresponds to the second delay optical path of the present disclosure, and the delay optical path DP2 corresponds to the first delay optical path of the present disclosure.

The amplifier 353 includes a multipath slab amplifier or a fiber amplifier. The amplifier 353 amplifies the pulse laser beam B9 and outputs the amplified pulse laser beam B9 as the pulse laser beam B3. The pulse laser beam B3 includes the first and second pre-pulse laser beams P1 and P2.

3.6.2 Operation and Effect

Figure 16B:
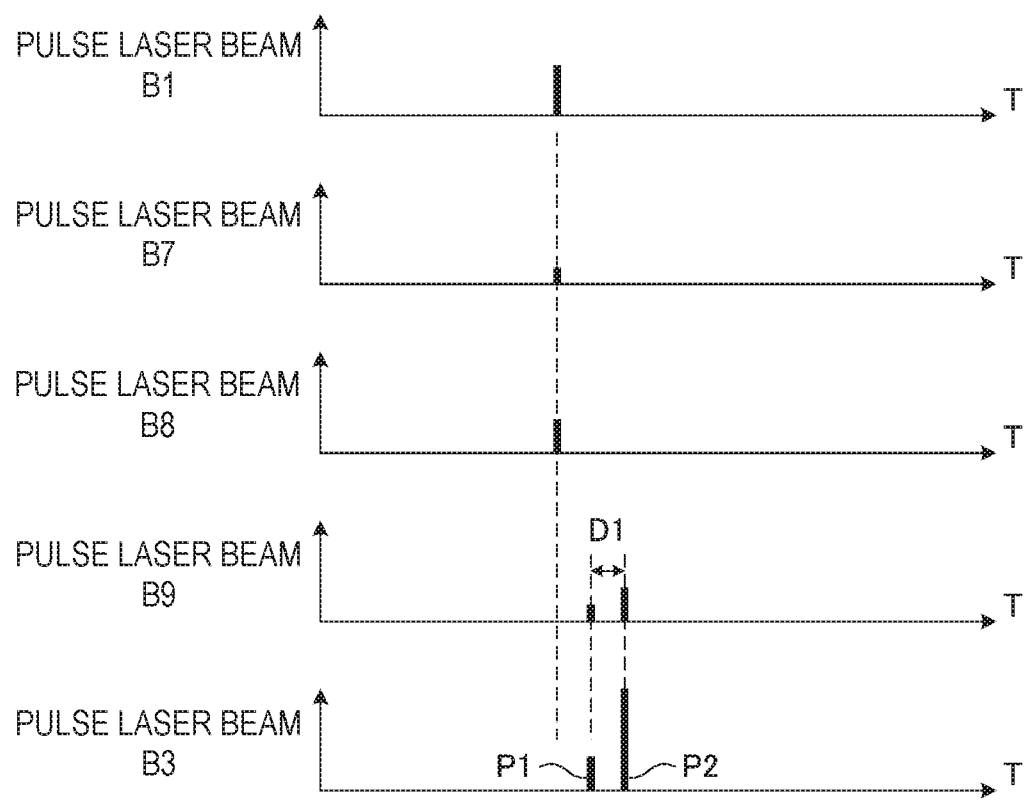
FIG. 16B is a time chart illustrating the process of generating the first and second pre-pulse laser beams in the third modification of the first embodiment.

FIG. 16B is a time chart illustrating the process of generating the first and second pre-pulse laser beams P1 and P2 in the third modification of the first embodiment. In FIG. 16B, the horizontal axis represents time T. The vertical axis represents pulse laser beam energy.

The pulse laser beam B1 is bifurcated into the pulse laser beams B7 and B8 through the retarder 357 and the polarizer 358. The ratio of the first and second polarization components can be adjusted by adjusting the direction of the optical axis of crystal included in the retarder 357. The pulse energy ratio of the pulse laser beams B7 and B8 can be adjusted by adjusting the ratio of the first and second polarization components. Thus, the pulse energy ratio of the first and second pre-pulse laser beams P1 and P2 can be adjusted by the tilt angle θ of the optical axis of crystal of the retarder 357 relative to the polarization direction of the pulse laser beam B1.

The polarizer 359 merges the pulse laser beams B7 and B8 and emits the merged pulse laser beams as the pulse laser beam B9. The time difference between the first and second polarization components included in the pulse laser beam B9 can be adjusted by the optical path length difference between the delay optical paths DP1 and DP2. The time difference between the first and second polarization components substantially corresponds to the first delay time D1. The first pre-pulse laser beam P1 is generated through amplification of the pulse laser beam B7 having passed through the delay optical path DP1, and the second pre-pulse laser beam P2 is generated through amplification of the pulse laser beam B8 having passed through the delay optical path DP2.

With the above-described alternative configuration, the first pre-pulse laser beam P1 is generated through amplification of the pulse laser beam B8 having passed through the delay optical path DP2, and the second pre-pulse laser beam P2 is generated through amplification of the pulse laser beam B7 having passed through the delay optical path DP1.

According to the third modification, the first and second pre-pulse laser beams P1 and P2 can be generated without controlling the pockels cells and the like.

In the third modification, the first and second pre-pulse laser beams P1 and P2 have polarization directions different from each other, but the present disclosure is not limited thereto. For example, an optical element for aligning the polarization directions of the first and second pre-pulse laser beams P1 and P2 or setting each polarization direction to be an optional polarization direction may be disposed between the polarizer 359 and the amplifier 353.

3.7 First Pre-Pulse Laser Beam of the Order of Nanoseconds 3.7.1 Configuration

Figure 17:
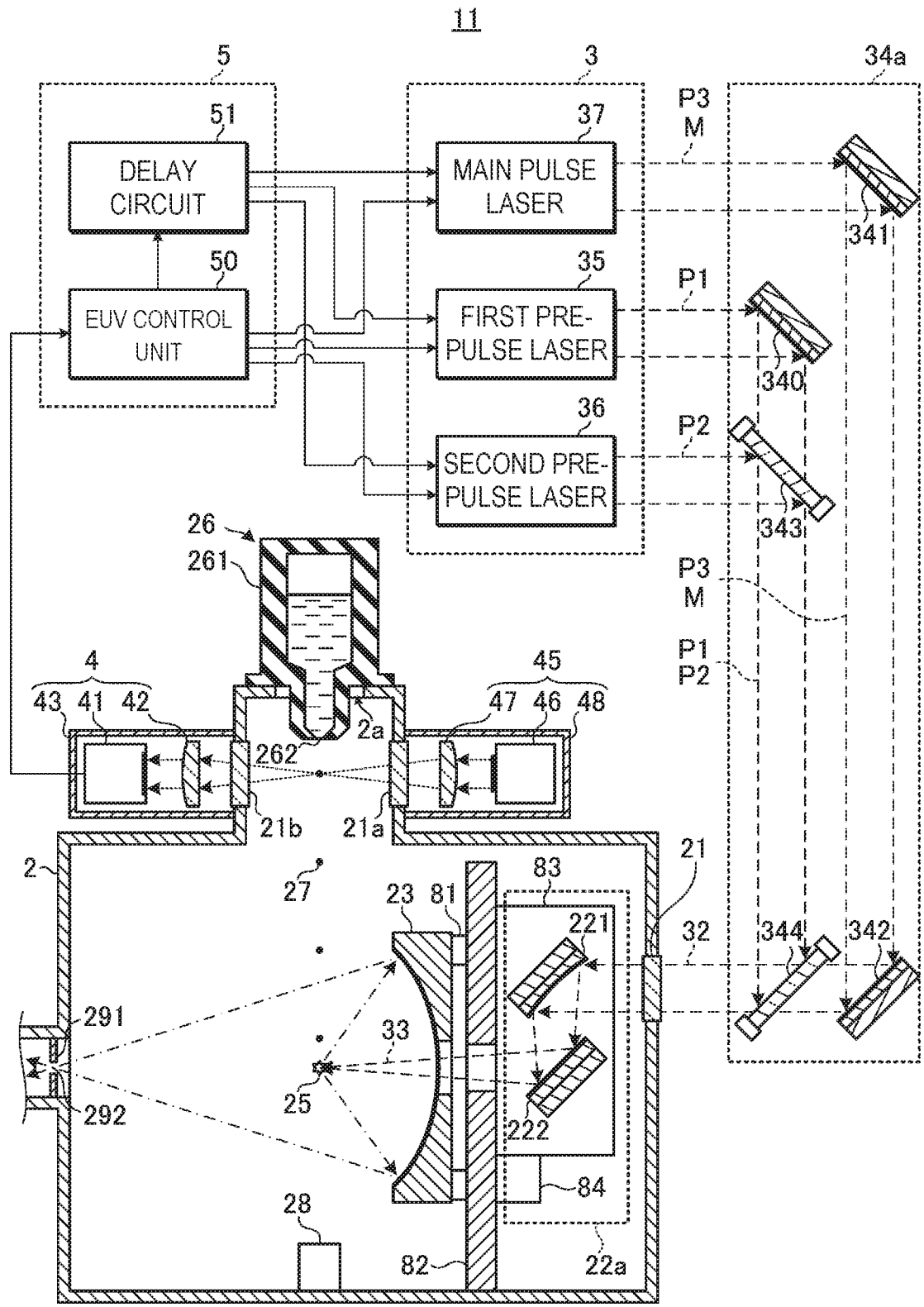
FIG. 17 is a partially cross-sectional view illustrating the configuration of the EUV light generation system according to a fourth modification of the first embodiment.

FIG. 17 is a partially cross-sectional view illustrating the configuration of the EUV light generation system 11 according to a fourth modification of the first embodiment. In the fourth modification, the first pre-pulse laser 35 outputs the first pre-pulse laser beam P1 having a pulse time width in the order of nanoseconds. In the present disclosure, the order of nanoseconds is equal to or longer than 1 ns and shorter than the third delay time D3. Alternatively, the order of nanoseconds may be equal to or longer than 1 ns and shorter than the second delay time D2. Alternatively, the order of nanoseconds may be equal to or longer than 1 ns and shorter than 1000 ns.

The second pre-pulse laser 36 outputs the second pre-pulse laser beam P2 having a pulse time width in the order of picoseconds.

The main pulse laser 37 outputs both the third pre-pulse laser beam P3 and the main pulse laser beam M. The configuration in which the main pulse laser 37 outputs both the third pre-pulse laser beam P3 and the main pulse laser beam M will be described later with reference to FIG. 19. Alternatively, a third pre-pulse laser (not illustrated) and the main pulse laser 37 may be separately used to output the third pre-pulse laser beam P3 and the main pulse laser beam M.

Any other feature of the configuration of the fourth modification is same as that described with reference to FIG. 6.

3.7.2 Ion Energy

Figure 18A:
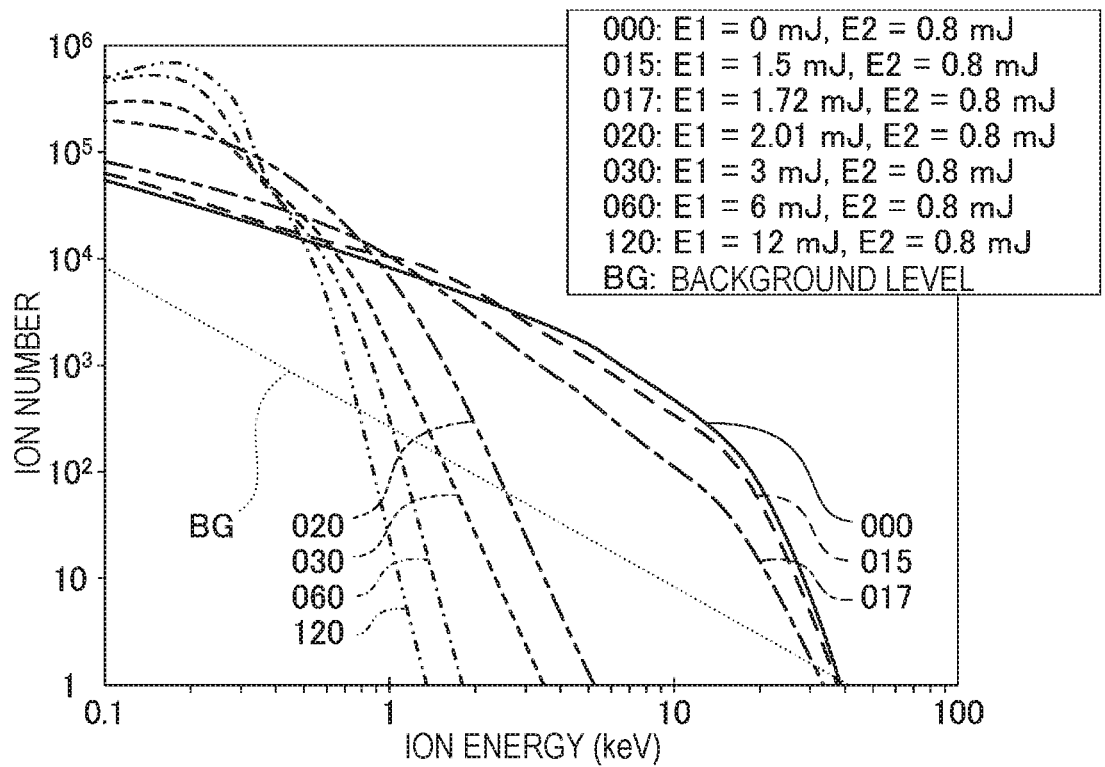
FIG. 18A is a graph illustrating ion energy of ions generated when a target is irradiated with the first and second pre-pulse laser beams in the fourth modification of the first embodiment.

FIG. 18A is a graph illustrating the ion energy of ions generated when the target 27 is irradiated with the first and second pre-pulse laser beams P1 and P2 in the fourth modification of the first embodiment. In FIG. 18A, the horizontal axis represents the ion energy. The vertical axis represents the number of ions. E1 represents the pulse energy of the first pre-pulse laser beam P1, and E2 represents the pulse energy of the second pre-pulse laser beam P2.

In measurement of the ion energy illustrated in FIG. 18A, the first pre-pulse laser beam P1 had a pulse time width of 6 ns at the full width at half maximum, and a spot diameter of 400 μm at the $1/e^2$ width.

The second pre-pulse laser beam P2 had a pulse time width of 18.8 ps at the full width at half maximum, and a spot diameter of 50 μm at the $1/e^2$ width.

The first delay time D1 from the timing of irradiation of the target 27 with the first pre-pulse laser beam P1 to the timing of irradiation of the target 27 with the second pre-pulse laser beam P2 was 10 ns.

As indicated by Reference sign 000 in FIG. 18A, when the pulse energy E1 of the first pre-pulse laser beam P1 was 0 mJ, ions having high ion energy were generated.

As illustrated in FIG. 18A, the ion energy of generated ions tends to decrease as the pulse energy E1 of the first pre-pulse laser beam P1 is increased in the following order.

Figure 18B:
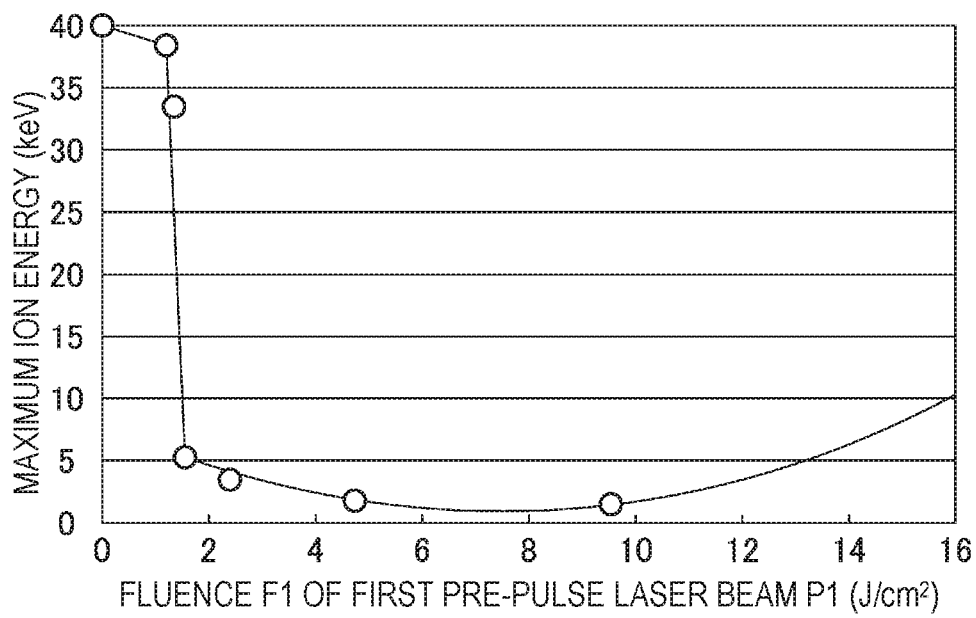
FIG. 18B is a graph illustrating the relation between the fluence of the first pre-pulse laser beam at the focal point and the maximum ion energy in the fourth modification of the first embodiment.

Reference sign 015: E1=1.5 mJ
Reference sign 017: E1=1.72 mJ
Reference sign 020: E1=2.01 mJ
Reference sign 030: E1=3 mJ
Reference sign 060: E1=6 mJ
Reference sign 120: E1=12 mJ FIG. 18B is a graph illustrating the relation between the fluence F1 of the first pre-pulse laser beam P1 at the focal point in the fourth modification of the first embodiment and the maximum ion energy. The graph in FIG. 18B is produced by converting the pulse energy E1 of the first pre-pulse laser beam P1 in the result illustrated in FIG. 18A into the fluence F1 and extracting the relation between the pulse energy E1 and the maximum ion energy.

As illustrated in FIG. 18B, the maximum ion energy can be reduced by irradiating the target 27 with the first pre-pulse laser beam P1 as compared to a case in which the target 27 is not irradiated with the first pre-pulse laser beam P1.

In addition, as illustrated with an approximate curve in FIG. 18B, the maximum ion energy can be reduced to 10 keV or less by setting the fluence F1 of the first pre-pulse laser beam P1 at the focal point to be 1.5 $J/cm^2$ to 16 $J/cm^2$ inclusive.

In addition, the maximum ion energy can be reduced to 5 keV or less by setting the fluence F1 of the first pre-pulse laser beam P1 at the focal point to be 1.8 $J/cm^2$ to 13 $J/cm^2$ inclusive.

In addition, the maximum ion energy can be reduced to 2.5 keV or less by setting the fluence F1 of the first pre-pulse laser beam P1 at the focal point to be 3 $J/cm^2$ to 11 $J/cm^2$.

The fluence F2 of the second pre-pulse laser beam P2 at the focal point is preferably 2 to 100 times larger than the fluence F1 of the first pre-pulse laser beam P1 at the focal point. In addition, the maximum ion energy is lowest for irradiation conditions denoted by Reference signs 060 and 120, and thus the fluence F2 is preferably 4 to 8 times larger than the fluence F1.

4. Main Pulse Laser Configured to Generate Two Pulses 4.1 Configuration

Figure 19:
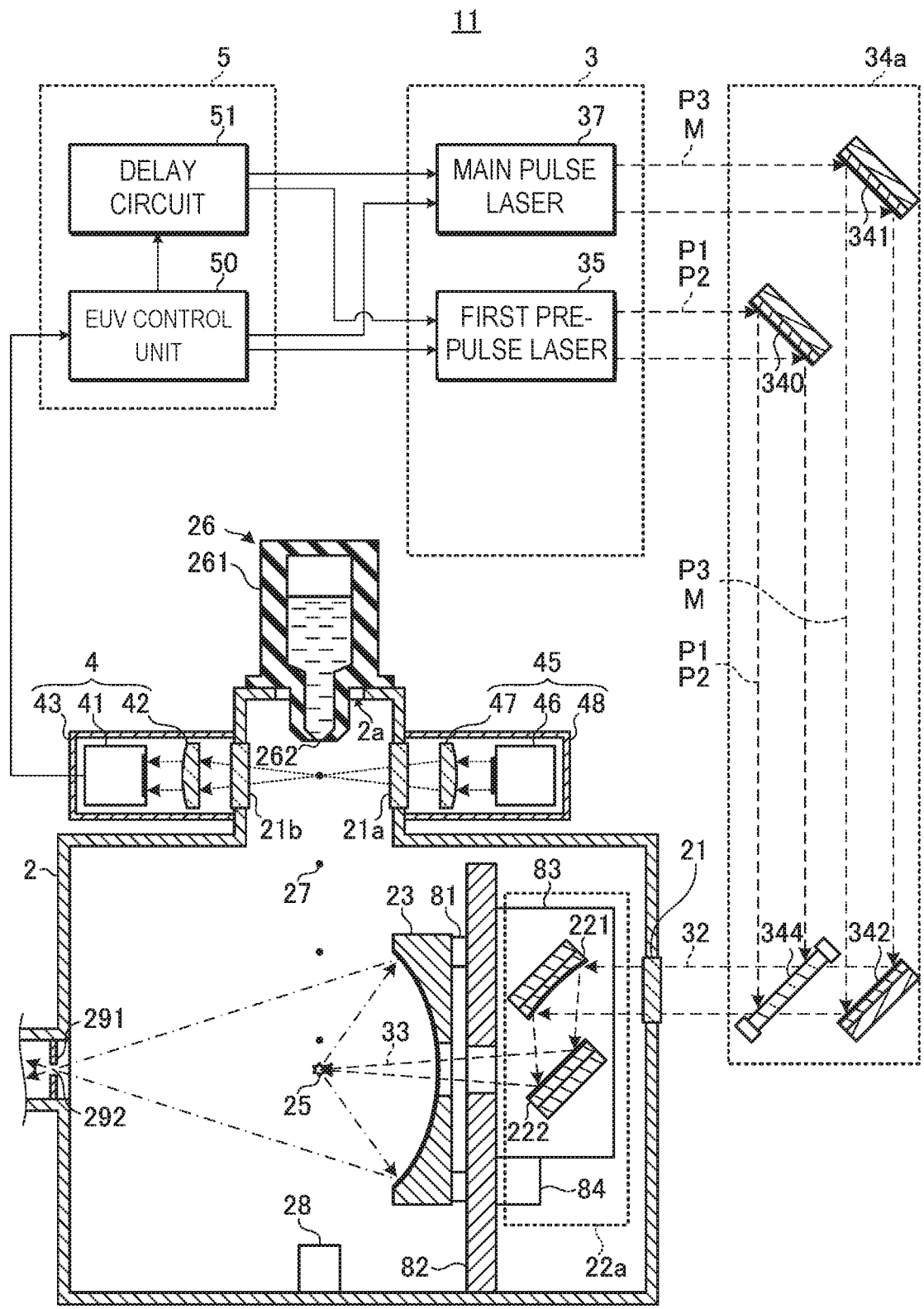
FIG. 19 is a partially cross-sectional view illustrating the configuration of the EUV light generation system according to a second embodiment of the present disclosure.

FIG. 19 is a partially cross-sectional view illustrating the configuration of the EUV light generation system 11 according to a second embodiment of the present disclosure. In the second embodiment, the main pulse laser 37 outputs the third pre-pulse laser beam P3 and the main pulse laser beam M.

Any other feature of the second embodiment is same as that of the first embodiment.

Figure 20A:
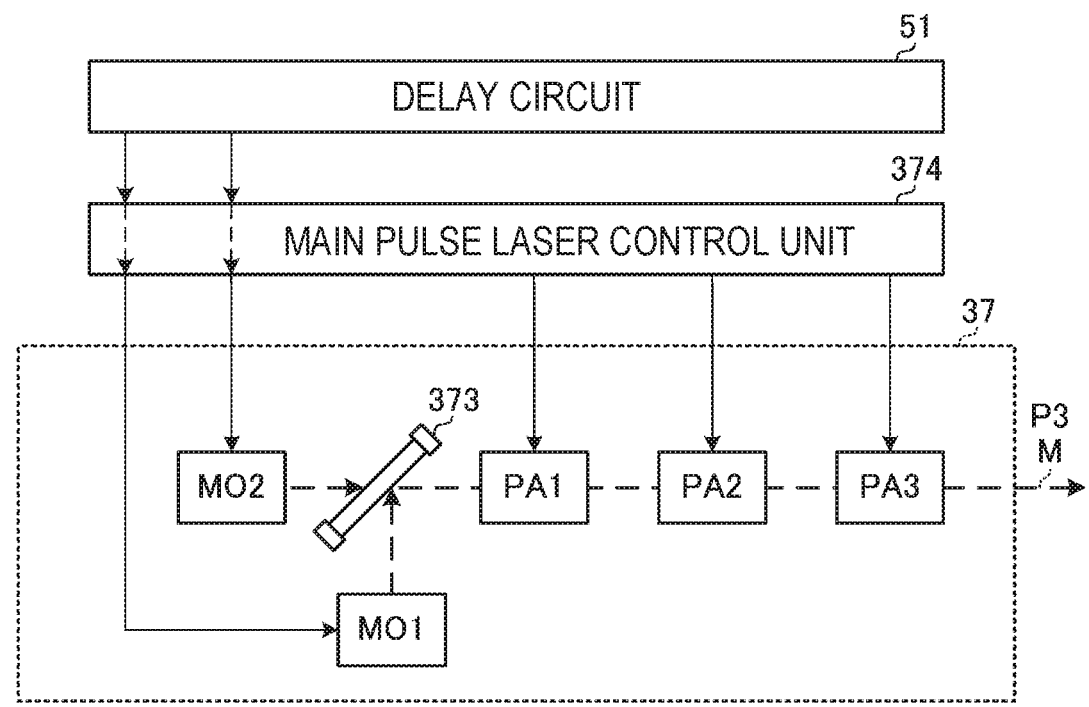
FIG. 20A is a block diagram illustrating the configuration of a main pulse laser in the second embodiment.

FIG. 20A is a block diagram illustrating the configuration of the main pulse laser 37 in the second embodiment. The main pulse laser 37 includes two master oscillators MO1 and MO2, a beam combiner 373, and a plurality of amplifiers PA1, PA2, and PA3. The master oscillators MO1 and MO2 each include, for example, a $CO_2$ laser oscillator including a Q switch (not illustrated), or a quantum cascade laser. The amplifiers PA1, PA2, and PA3 each include, for example, a $CO_2$ laser amplifier.

A main pulse laser control unit 374 connects the delay circuit 51 and the main pulse laser 37 through a signal line. The main pulse laser control unit 374 may be included in the EUV light generation control unit 5 or may be integrated with the EUV light generation control unit 5.

4.2 Operation

Figure 20B:
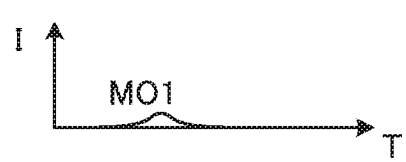
FIG. 20B illustrates the pulse waveform of a pulse laser beam output from a master oscillator MO1 in the second embodiment.

FIG. 20B illustrates the pulse waveform of a pulse laser beam output from the master oscillator MO1 in the second embodiment. The main pulse laser control unit 374 outputs an oscillation trigger signal to the master oscillator MO1 in accordance with a trigger signal transmitted from the delay circuit 51. The master oscillator MO1 outputs the pulse laser beam in accordance with the oscillation trigger signal.

Figure 20C:
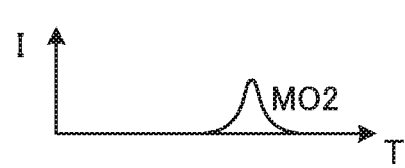
FIG. 20C illustrates the pulse waveform of a pulse laser beam output from a master oscillator MO2 in the second embodiment.

FIG. 20C illustrates the pulse waveform of a pulse laser beam output from the master oscillator MO2 in the second embodiment. The main pulse laser control unit 374 outputs an oscillation trigger signal to the master oscillator MO2 in accordance with a trigger signal transmitted from the delay circuit 51. The master oscillator MO2 outputs the pulse laser beam in accordance with the oscillation trigger signal.

Figure 20D:
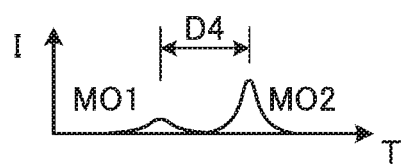
FIG. 20D illustrates the pulse waveform of a pulse laser beam emitted from a beam combiner in the second embodiment.

FIG. 20D illustrates the pulse waveform of a pulse laser beam emitted from the beam combiner 373 in the second embodiment. The beam combiner 373 connects the optical paths of the pulse laser beams output from the master oscillators MO1 and MO2, respectively, and emits the pulse laser beams toward the amplifier PA1.

The pulse laser beam output from the master oscillator MO2 has a predetermined time difference relative to the pulse laser beam output from the master oscillator MO1. The pulse laser beam output from the master oscillator MO2 has an energy larger than that of the pulse laser beam output from the master oscillator MO1.

Figure 20E:
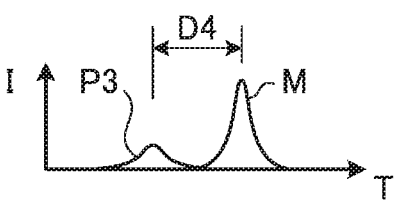
FIG. 20E illustrates the pulse waveform of a pulse laser beam emitted from an amplifier PA3 in the second embodiment.

FIG. 20E illustrates the pulse waveform of a pulse laser beam emitted from the amplifier PA3 in the second embodiment. The amplifiers PA1 to PA3 amplify the pulse laser beams emitted from the beam combiner 373 and output the amplified pulse laser beams as the third pre-pulse laser beam P3 and the main pulse laser beam M. The time difference between the pulse laser beams output from the master oscillators MO1 and MO2 substantially corresponds to the fourth delay time D4 from the timing of irradiation of the target 27 with the third pre-pulse laser beam P3 to the timing of irradiation of the target 27 with the main pulse laser beam M.

4.3 Effect

According to the second embodiment, since both the third pre-pulse laser beam P3 and the main pulse laser beam M are output from the one main pulse laser 37, the configuration of the laser system 3 can be simplified.

In the second embodiment, the beam combiner 373 is disposed between the master oscillator MO2 and the amplifier PA1, but the present disclosure is not limited thereto. When the third pre-pulse laser beam P3 does not need to be largely amplified, the beam combiner 373 may be disposed between the amplifier PA1 and the amplifier PA2 or between the amplifier PA2 and the amplifier PA3.

In the second embodiment, the third pre-pulse laser beam P3 and the main pulse laser beam M are output from the main pulse laser 37 as separate pulses, but the present disclosure is not limited thereto. The time difference between the pulse laser beams output from the master oscillators MO1 and MO2 may be set to be short so that two pulses are close to each other to generate a main pulse laser beam including a pedestal part.

Figure 21:
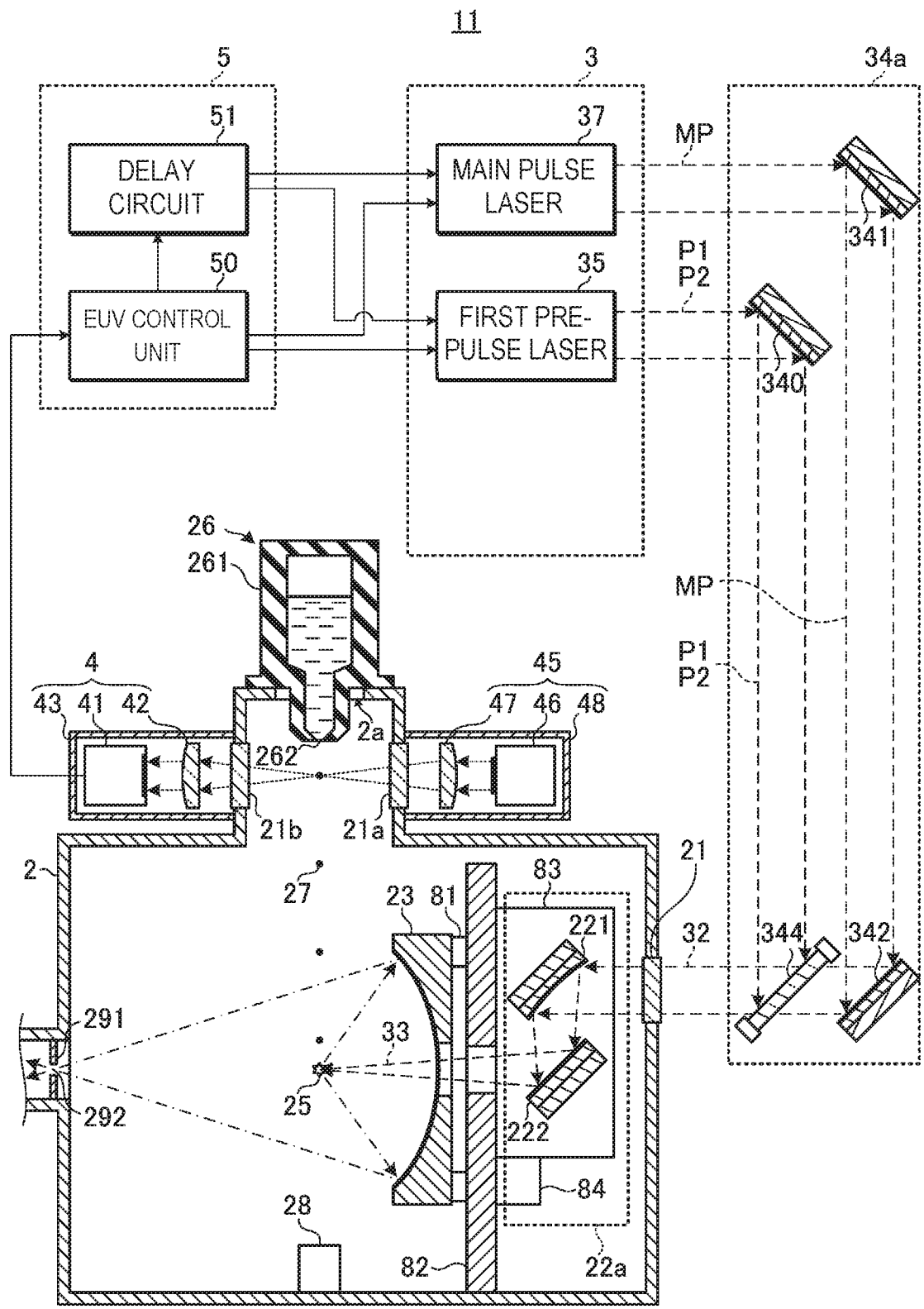
FIG. 21 is a partially cross-sectional view illustrating the configuration of the EUV light generation system according to a modification of the second embodiment.

4.4 Main Pulse Laser Configured to Generate Main Pulse Including Pedestal Part 4.4.1 Configuration FIG. 21 is a partially cross-sectional view illustrating the configuration of the EUV light generation system 11 according to a modification of the second embodiment. In the modification of the second embodiment, the main pulse laser 37 outputs a main pulse laser beam MP including a pedestal part.

Any other feature is same as that described with reference to FIG. 19.

Figure 22A:
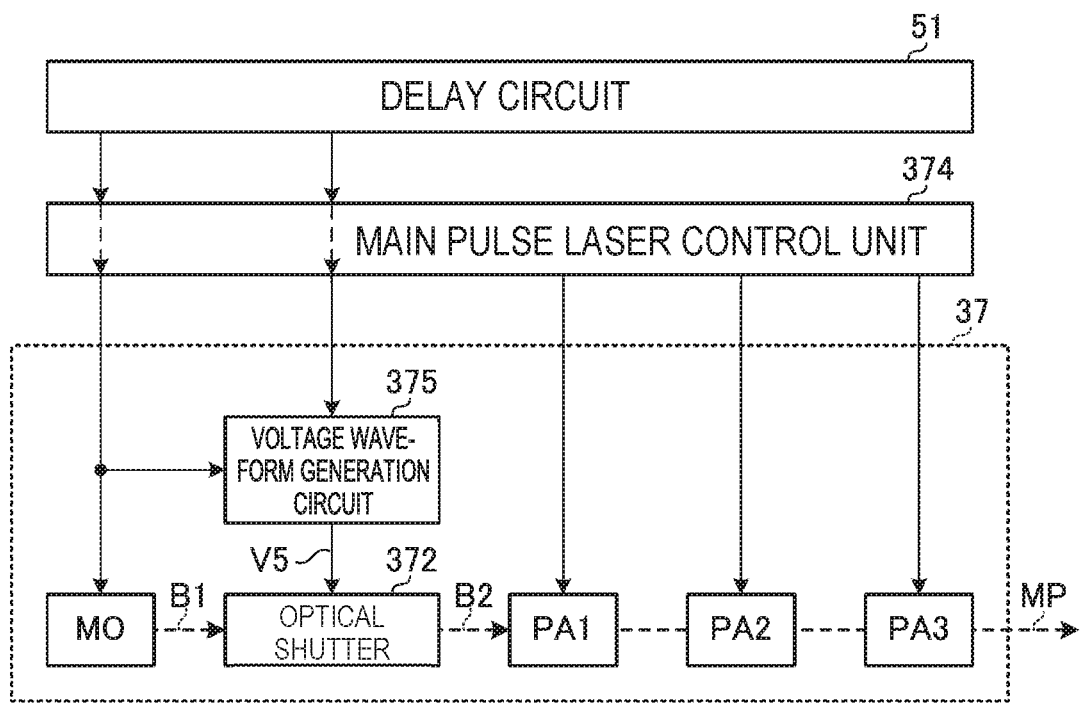
FIG. 22A is a block diagram illustrating the configuration of the main pulse laser in the modification of the second embodiment.

FIG. 22A is a block diagram illustrating the configuration of the main pulse laser 37 in the modification of the second embodiment. The main pulse laser 37 includes the master oscillator MO, an optical shutter 372, the amplifiers PA1, PA2, and PA3, and a voltage waveform generation circuit 375.

4.4.2 Operation

Figure 22B:
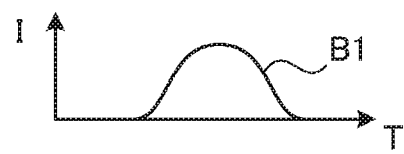
FIG. 22B illustrates the pulse waveform of a pulse laser beam B1 output from a master oscillator in the modification of the second embodiment.

FIG. 22B illustrates the pulse waveform of the pulse laser beam B1 output from the master oscillator MO in the modification of the second embodiment. The main pulse laser control unit 374 outputs an oscillation trigger signal to the master oscillator MO in accordance with a trigger signal transmitted from the delay circuit 51. The master oscillator MO outputs the pulse laser beam B1 in accordance with the oscillation trigger signal.

Figure 22D:
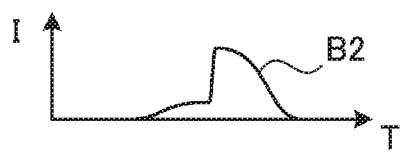
FIG. 22D illustrates the pulse waveform of a pulse laser beam B2 having passed through the optical shutter in the modification of the second embodiment.
Figure 22C:
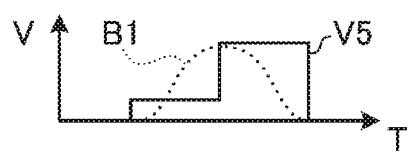
FIG. 22C illustrates the pulse waveform of an optical shutter control voltage output from a voltage waveform generation circuit in the modification of the second embodiment.

FIG. 22C illustrates the pulse waveform of optical shutter control voltage V5 output from the voltage waveform generation circuit 375 in the modification of the second embodiment. The optical shutter control voltage V5 is a stepped pulse including a first half part having a low voltage value, and a second half part having a high voltage value.

FIG. 22D illustrates the pulse waveform of the pulse laser beam B2 having passed through the optical shutter 372 in the modification of the second embodiment. The transmittance of the optical shutter 372 is low when the voltage value of the optical shutter control voltage V5 is low, but the transmittance is high when the voltage value of the optical shutter control voltage V5 is high. Thus, the pulse waveform of the pulse laser beam B2 includes a first half part in which the light intensity is low and gradually increases, and a second half part in which the light intensity abruptly increases to a high value and then decreases.

Figure 22E:
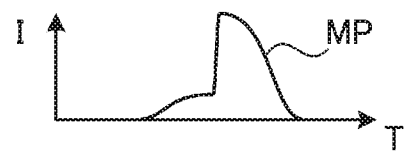
FIG. 22E illustrates the pulse waveform of the main pulse laser beam having passed through the amplifier PA3 in the modification of the second embodiment.

FIG. 22E illustrates the pulse waveform of the main pulse laser beam MP having passed through the amplifier PA3 in the modification of the second embodiment. The amplifiers PA1 to PA3 amplify the pulse laser beam B2 and output the main pulse laser beam MP. The pulse waveform of the main pulse laser beam MP includes a pedestal part in which the light intensity is low and gradually increases, and a peak part in which the light intensity abruptly increases to a high value and then decreases.

Figure 23:
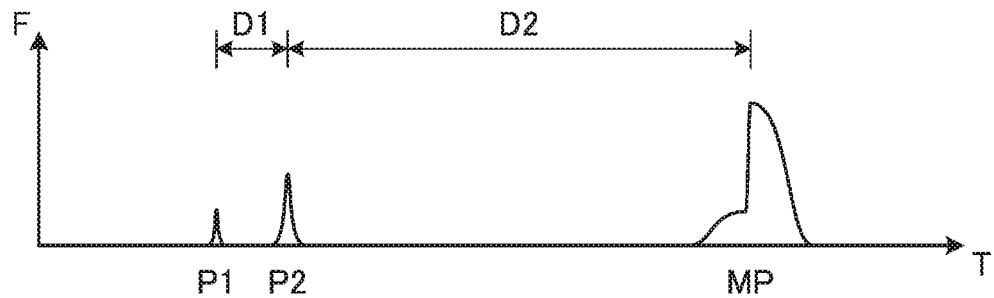
FIG. 23 is a pulse waveform diagram of the first and second pre-pulse laser beams and the main pulse laser beam including a pedestal part in the modification of the second embodiment.

FIG. 23 is a pulse waveform diagram of the first and second pre-pulse laser beams P1 and P2 and the main pulse laser beam MP including the pedestal part in the modification of the second embodiment.

The delay times D1 and D2 between pulses has a relation as follows.

$D1<D2$

The delay time D2 when the target 27 is irradiated with the main pulse laser beam MP including the pedestal part in place of the main pulse laser beam M is defined as follows.

The second delay time D2 is a delay time from the timing of irradiation of the target 27 with the second pre-pulse laser beam P2 to the timing of irradiation of the target 27 with the main pulse laser beam MP.

4.4.3 Effect

According to the modification of the second embodiment, plasma can be efficiently generated from the target 27 by generating the main pulse laser beam MP including the pedestal part.

The first half part and the second half part included in the optical shutter control voltage V5 do not necessarily need to be temporally continuous with each other but may be temporally separated from each other and generated as separate square wave pulses. When the first half part and the second half part of the optical shutter control voltage V5 are temporally separated from each other, the pulse laser beam B2 is two pulses temporally separated from each other. Accordingly, the third pre-pulse laser beam P3 and the main pulse laser beam M can be output from the amplifier PA3.

5. Other

Figure 24:
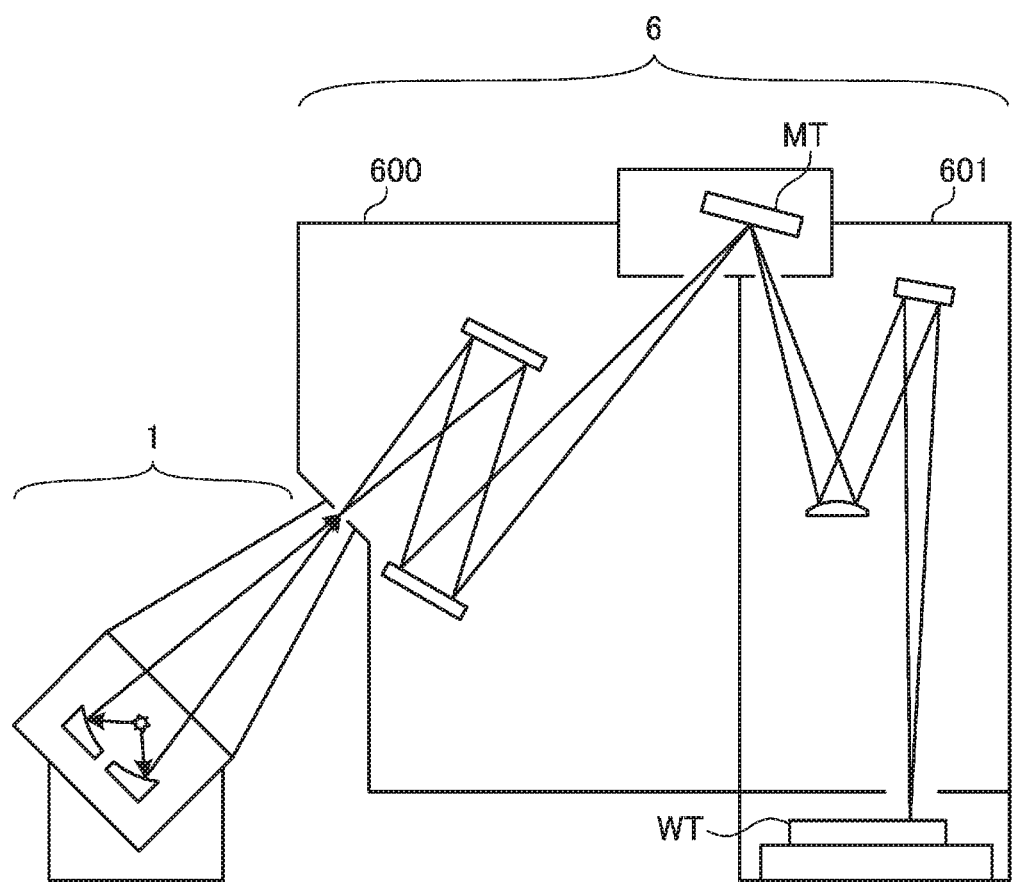
FIG. 24 schematically illustrates the configuration of an exposure apparatus connected with an EUV light generation apparatus.

FIG. 24 schematically illustrates the configuration of the exposure apparatus 6 connected with the EUV light generation apparatus 1.

In FIG. 24, the exposure apparatus 6 includes a mask irradiation unit 600 and a workpiece irradiation unit 601. The mask irradiation unit 600 illuminates, with EUV light incident from the EUV light generation apparatus 1, a mask pattern on a mask table MT through a reflection optical system. The workpiece irradiation unit 601 images the EUV light reflected by the mask table MT onto a workpiece (not illustrated) disposed on a workpiece table WT through the reflection optical system. The workpiece is a photosensitive substrate such as a semiconductor wafer to which photoresist is applied. The exposure apparatus 6 translates the mask table MT and the workpiece table WT in synchronization to expose the workpiece to the EUV light reflected at the mask pattern. Through the exposure process as described above, a device pattern is transferred onto the semiconductor wafer, thereby manufacturing an electronic device.

The description above is intended to be illustrative and the present disclosure is not limited thereto. Therefore, it would be obvious to those skilled in the art that various modifications to the embodiments of the present disclosure would be possible without departing from the spirit and the scope of the appended claims. Further, it would be also obvious for those skilled in the art that embodiments of the present disclosure would be appropriately combined.

The terms used throughout the present specification and the appended claims should be interpreted as non-limiting terms. For example, terms such as "comprise", "include", "have", and "contain" should not be interpreted to be exclusive of other structural elements. Further, indefinite articles "a/an" described in the present specification and the appended claims should be interpreted to mean "at least one" or "one or more." Further, "at least one of A, B, and C" should be interpreted to mean any of A, B, C, A+B, A+C, B+C, and A+B+C as well as to include combinations of the any thereof and any other than A, B, and C.

What is claimed is:

1. An extreme ultraviolet light generation system comprising:
    a chamber;
    a target generation unit configured to output a target toward a predetermined region in the chamber;
    a laser system configured to output a first pre-pulse laser beam, a second pre-pulse laser beam, and a main pulse laser beam to irradiate the target with the first pre-pulse laser beam, the second pre-pulse laser beam, and the main pulse laser beam in this order so that fluence of the first pre-pulse laser beam is 1.5 J/cm$^2$ to 16 J/cm$^2$ inclusive at a position where the target is irradiated with the first pre-pulse laser beam; and
    a control unit configured to control the laser system so that a first delay time from a timing of irradiation of the target with the first pre-pulse laser beam to a timing of irradiation of the target with the second pre-pulse laser beam and a second delay time from the timing of irradiation of the target with the second pre-pulse laser beam to a timing of irradiation of the target with the main pulse laser beam have a following relation:

the first delay time<the second delay time, wherein the laser system includes
        a master oscillator,
        a first polarizer disposed on an optical path of a pulse laser beam output from the master oscillator and configured to bifurcate the pulse laser beam into a first laser beam including a first polarization component and a second laser beam including a second polarization component,
        a second polarizer configured to merge the first laser beam and the second laser beam and output the merged laser beams as the first pre-pulse laser beam and the second pre-pulse laser beam,
        a first delay optical path included in an optical path of the first laser beam between the first polarizer and the second polarizer, and
        a second delay optical path included in an optical path of the second laser beam between the first polarizer and the second polarizer, the second delay optical path being longer than the first delay optical path.

2. The extreme ultraviolet light generation system according to claim 1, wherein the laser system is configured so that fluence of the second pre-pulse laser beam at a position where the target is irradiated with the second pre-pulse laser beam is 5 to 10 times larger than the fluence of the first pre-pulse laser beam at a position where the target is irradiated with the first pre-pulse laser beam.

3. The extreme ultraviolet light generation system according to claim 1, wherein the control unit controls the laser system so that the first delay time is 5 ns to 100 ns inclusive.

4. The extreme ultraviolet light generation system according to claim 1, wherein the laser system includes a mode lock laser apparatus configured to output a pulse laser beam including a plurality of pulses, and an optical device configured to generate the first pre-pulse laser beam and the second pre-pulse laser beam from at least one of the pulses.

5. The extreme ultraviolet light generation system according to claim 1, wherein the laser system further outputs a third pre-pulse laser beam to irradiate the target with the third pre-pulse laser beam after the target is irradiated with the second pre-pulse laser beam and before the target is irradiated with the main pulse laser beam.

6. The extreme ultraviolet light generation system according to claim 5, wherein the control unit controls the laser system so that the first delay time, a third delay time from a timing of irradiation of the target with the second pre-pulse laser beam to a timing of irradiation of the target with the third pre-pulse laser beam, and a fourth delay time from the timing of irradiation of the target with the third pre-pulse laser beam to a timing of irradiation of the target with the main pulse laser beam have a following relation:

the first delay time the fourth delay time<the third delay time.

7. The extreme ultraviolet light generation system according to claim 5, wherein the laser system includes a $CO_2$ laser apparatus configured to output the third pre-pulse laser beam and the main pulse laser beam.

8. An electronic device manufacturing method comprising:
    generating extreme ultraviolet light by irradiating a target with a pulse laser beam in an extreme ultraviolet light generation system;
    outputting the extreme ultraviolet light to an exposure apparatus; and
    exposing a photosensitive substrate to the extreme ultraviolet light in the exposure apparatus to manufacture an electronic device,
    the extreme ultraviolet light generation system including
        a chamber,
        a target generation unit configured to output a target toward a predetermined region in the chamber,
        a laser system configured to output a first pre-pulse laser beam, a second pre-pulse laser beam, and a main pulse laser beam to irradiate the target with the first pre-pulse laser beam, the second pre-pulse laser beam, and the main pulse laser beam in this order so that fluence of the first pre-pulse laser beam is 1.5 J/cm$^2$ to 16 J/cm$^2$ inclusive at a position where the target is irradiated with the first pre-pulse laser beam, and
        a control unit configured to control the laser system so that a first delay time from a timing of irradiation of the target with the first pre-pulse laser beam to a timing of irradiation of the target with the second pre-pulse laser beam and a second delay time from the timing of irradiation of the target with the second pre-pulse laser beam to a timing of irradiation of the target with the main pulse laser beam have a following relation:

the first delay time<the second delay time, wherein
the laser system includes
  a master oscillator,
  a first polarizer disposed on an optical path of a pulse laser beam output from the master oscillator and configured to bifurcate the pulse laser beam into a first laser beam including a first polarization component and a second laser beam including a second polarization component,
  a second polarizer configured to merge the first laser beam and the second laser beam and output the merged laser beams as the first pre-pulse laser beam and the second pre-pulse laser beam,
  a first delay optical path included in an optical path of the first laser beam between the first polarizer and the second polarizer, and
a second delay optical path included in an optical path of the second laser beam between the first polarizer and the second polarizer, the second delay optical path being longer than the first delay optical path.

* * * * *